United States Patent [19]

Yamashita et al.

[11] Patent Number: 5,187,458
[45] Date of Patent: Feb. 16, 1993

[54] COMPOSITE LONGITUDINAL VIBRATION MECHANICAL FILTER HAVING CENTRAL FREQUENCY DEVIATION ELIMINATION MEANS AND METHOD OF MANUFACTURING SAME

[75] Inventors: Kazuo Yamashita; Yoshihiko Takeuchi; Masahiro Watanabe, all of Tokyo, Japan

[73] Assignee: Nihon Musen Kabushiki Kaisha, Tokyo, Japan

[21] Appl. No.: 483,454

[22] Filed: Feb. 21, 1990

[30] Foreign Application Priority Data

| Sep. 21, 1989 | [JP] | Japan | 1-247396 |
| Sep. 21, 1989 | [JP] | Japan | 1-247397 |
| Sep. 21, 1989 | [JP] | Japan | 1-247398 |
| Sep. 21, 1989 | [JP] | Japan | 1-247399 |
| Oct. 16, 1989 | [JP] | Japan | 1-269808 |
| Oct. 16, 1989 | [JP] | Japan | 1-269809 |
| Oct. 16, 1989 | [JP] | Japan | 1-269810 |
| Oct. 16, 1989 | [JP] | Japan | 1-296807 |

[51] Int. Cl.⁵ .................. H03H 3/007; H03H 9/46
[52] U.S. Cl. .................. 333/197; 333/198; 29/25.35
[58] Field of Search .............. 333/186, 187–192, 333/197–199; 29/25.35

[56] References Cited

U.S. PATENT DOCUMENTS

| 2,814,785 | 11/1957 | Burns, Jr. | 333/198 |
| 3,488,530 | 1/1970 | Stoudte | 310/366 X |
| 3,490,056 | 5/1967 | Warren et al. | 333/186 |
| 4,421,381 | 12/1983 | Ueda et al. | 333/186 X |
| 4,571,794 | 2/1986 | Nakamura | 29/25.35 |
| 4,658,173 | 4/1987 | Nakamura et al. | 310/321 |
| 4,701,987 | 10/1987 | Studer | 29/25.35 |

FOREIGN PATENT DOCUMENTS

| 0118272 | 2/1984 | European Pat. Off. |
| 294090 | 12/1988 | European Pat. Off. | 333/187 |
| 1241920 | 6/1967 | Fed. Rep. of Germany | 333/198 |
| DE-A1416791 | 10/1968 | Fed. Rep. of Germany |
| 6915 | 1/1986 | Japan | 333/186 |
| 69208 | 4/1986 | Japan | 333/191 |
| 139115 | 6/1986 | Japan | 333/187 |
| 919581 | 2/1961 | United Kingdom |
| 959462 | 2/1961 | United Kingdom |
| 948889 | 6/1962 | United Kingdom |
| 1370729 | 8/1972 | United Kingdom |
| 1378558 | 8/1972 | United Kingdom |
| 1437288 | 5/1974 | United Kingdom |
| 2004434 | 9/1978 | United Kingdom |
| 2017443 | 2/1979 | United Kingdom |
| 2042797 | 11/1979 | United Kingdom |
| 2098395 | 3/1982 | United Kingdom |
| 2103874 | 3/1982 | United Kingdom |

*Primary Examiner*—Paul M. Dzierzynski
*Assistant Examiner*—Benny Lee
*Attorney, Agent, or Firm*—Frishauf, Holtz, Goodman & Woodward

[57] ABSTRACT

A composite longitudinal vibration mechanical filter for delivering out a supplied high-frequency signal in a predetermined frequency range includes a plurality of vibratable bodies including input and output longitudinal vibratable tuning bars with piezoelectric members superposed thereon, coupling elements by which the longitudinally vibratable tuning bars are coupled to each other, supporting elements projecting respectively from the input and output longitudinally vibratable tuning bars, and a holder to which the supporting elements are attached. Grooves are defined in the longitudinally vibratable tuning bars at the same time that they are fabricated. The grooves extend in the direction in which the longitudinally vibratable tuning bars are longitudinally vibratable, and are shorter than the length of the longitudinally vibratable tuning bars. Through holes may instead be defined in the longitudinally vibratable tuning bars, the through holes having an opening size smaller than the wavelength of the longitudinal vibration of the longitudinally vibratable tuning bars. Piezoelectric members are fixedly superposed on the input and output longitudinally vibratable tuning bars in sandwiching relation thereto.

24 Claims, 24 Drawing Sheets (a)

(b)

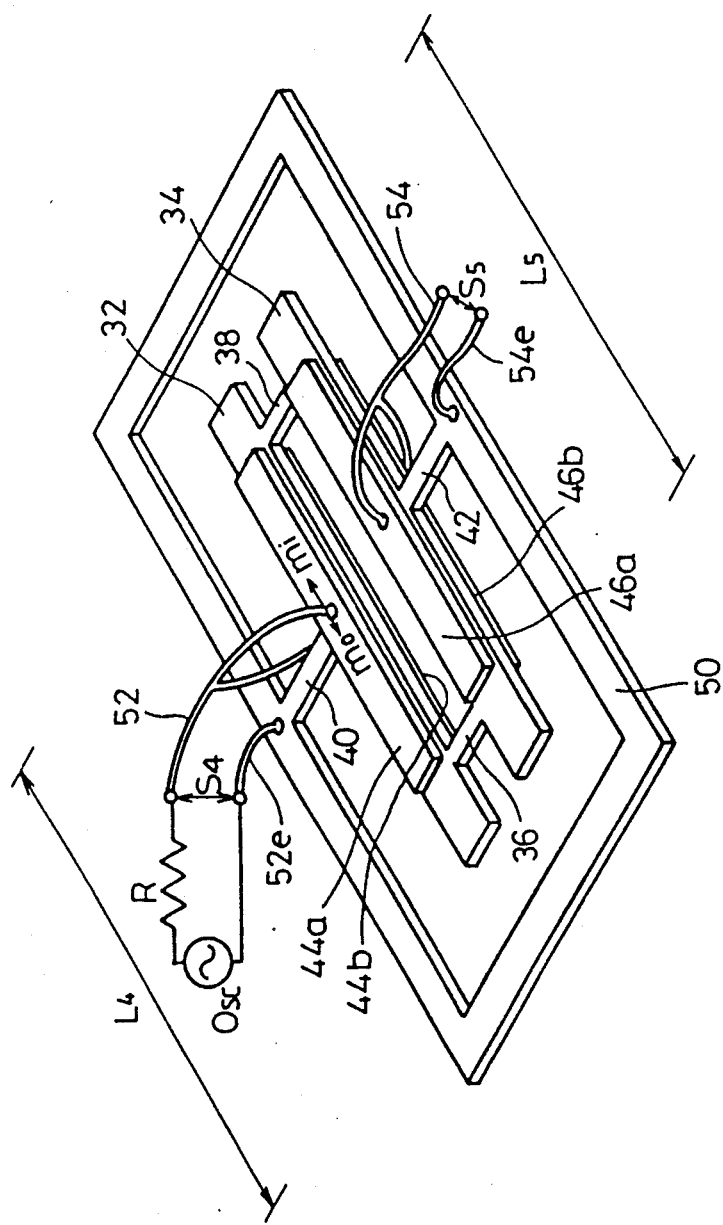

COMPOSITE LONGITUDINAL VIBRATION MECHANICAL FILTER HAVING CENTRAL FREQUENCY DEVIATION ELIMINATION MEANS AND METHOD OF MANUFACTURING SAME

BACKGROUND OF THE INVENTION

The present invention relates to a composite longitudinal vibration mechanical filter which comprises longitudinally vibratable bodies (hereinafter also referred to as "longitudinally vibratable tuning bars"), piezoelectric elements, coupling elements, and supporting elements, and which is capable of appropriately reducing frequency fluctuations due to different lengths of the longitudinally vibratable tuning bars, undesired spurious responses, and passband deteriorations, or of well adjusting the resonant frequency, when desired frequency characteristics are created by the transmission of composite longitudinal vibration, and a method of manufacturing such a composite longitudinal vibration mechanical filter.

Recently, mechanical filters having characteristics which are of an intermediate level as compared with those of LC filters and quartz filters are widely used in communication devices. Such mechanical filters have a good Q factor, a good selectivity, and a good temperature characteristic, and can be reduced in size.

One conventional composite longitudinal vibration mechanical filter is shown in FIG. 1 of the accompanying drawings. The mechanical filter has an input longitudinally vibratable tuning bar 2 and an output longitudinally vibratable tuning bar 4 which are disposed in the same plane and are made of a metal material. Identity elastic coupling elements 6, 8 are joined to the input and output longitudinally vibratable tuning bars 2, 4, and supporting elements 10, 12 project outwardly from the centers of the tuning bars 2, 4. The tuning bars 2, the coupling elements 6, 8, and the supporting elements 10, 12 are fabricated by precision pressing and joined together by laser welding or the like. A pair of input piezoelectric ceramic members 14a, 14b is superposed on and fixed to the input longitudinally vibratable tuning bar 2 by soldering or the like, and similarly a pair of output piezoelectric ceramic members 16a, 16b is superposed on and fixed to the output longitudinally vibratable tuning bar 4 by sodering or the like. The supporting members 10, 12 have outer ends secured to upper central surfaces of upstanding members 24a, 24b, respectively, of a holder 24 by laser welding or the like.

A feed line 18 and a grounding line 18e, between which an input signal is supplied, are connected to the input piezoelectric ceramic members 14a, 14b and the upstanding member 24a, respectively. Likewise, an outlet line 20 and a grounding line 20e, from which an output signal is led out, are connected to the output piezoelectric ceramic members 16a, 16b and the upstanding member 24b, respectively.

The input and output longitudinally vibratable tuning bars 2, 4, which are coupled to each other by the coupling elements 6, 8, are held in space so that they can be longitudinally vibrated unobstructedly. The composite longitudinal vibration mechanical filter is housed in a casing (not shown), which is mounted in an intermediate frequency amplifier in a communication device or the like.

The composite longitudinal vibration mechanical filter shown in FIG. 1 operates as follows: A high-frequency signal $S_1$ produced by a signal source Osc is supplied to a resistor R and then fed to feed line 18 and the grounding line 18e, and applied to electrodes (not shown) attached to the input piezoelectric ceramic members 14a, 14b. The applied high-frequency signal $S_1$ generates an electric field having the same frequency as that of the signal $S_1$, between the electrodes and the input longitudinally vibratable tuning bar 2 which is electrically grounded In response to the electric field thus generated, the input piezoelectric ceramic members 14a, 14b are mechanically deformed in the directions indicated by the arrows Vm, Vn in FIG. 1, and the input longitudinally vibratable tuning bar 2 resonates to produce a longitudinal wave having a frequency $F_1$ and a half wavelength which is equal to the length $L_1$ of the input longitudinally vibratable tuning bar 2. If the longitudinal wave propagated along the input longitudinally vibratable tuning bar 2 at an average speed V, then the frequency $F_1$ is given by the following equation:

$$F_1 = V/(2L_1) \tag{1}$$

The longitudinal vibration of the input longitudinally vibratable tuning bar 2 is mechanically coupled and propagated to the output longitudinally vibratable tuning bar 4 to the coupling elements 6, 8, causing the output longitudinally vibratable tuning bar 4 to resonate or vibrate longitudinally at a frequency $F_2$ and with a half wavelength equal to the length $L_2$ of the tuning bar 4. If the longitudinal wave is propagated to the output longitudinally vibratable tuning bar 4 at an average speed V, then the frequency $F_2$ is given by the following equation:

$$F_2 = V/(2L_2) \tag{2}$$

The longitudinal vibration of the output longitudinally vibratable tuning bar 4 produces a voltage between the output piezoelectric ceramic members 16a, 16b. The produced voltage is then led out between the outlet line 20 and the grounding line 20e as a high-frequency signal $S_2$ having a sharp frequency characteristic curve.

In the process of manufacturing the composite longitudinal vibration mechanical filter shown in FIG. 1, much importance is attached to the accuracy of a central frequency and the bandpass characteristics of the produced mechanical filter, and it is desired that the resonant frequencies $F_1$, $F_2$ of the input and output longitudinally vibratable tuning bars 2, 4 have the same central frequency. However, since the input and output longitudinally vibratable tuning bars 2, 4 are mass-produced in large quantities by etching or precision pressing, it is difficult to give the individual components a sufficient level of dimensional accuracy. As a result, the mass-produced mechanical filters have different central frequencies and relatively poor bandpass characteristics.

The feed line 18 and the outlet line 20 are spaced from each other to reduce the inductive coupling therebetween due to a stray capacitance, i.e., to increase the isolation therebetween. However, since an undesired vibratory wave which is produced by the input longitudinally vibratable tuning bar 2 is transmitted to the output longitudinally vibratable tuning bar 4 via the coupling elements 6, 8 and the supporting elements 10, 12, unwanted spurious responses are created outside of the passband of the mechanical filter.

SUMMARY OF THE INVENTION

It is a general object of the present invention to provide a composite longitudinal vibration mechanical filter which has improved frequency characteristics, can well be mass-produced, and has desired passband and spurious response characteristics, and a method of manufacturing such a composite longitudinal vibration mechanical filter.

Another object of the present invention is to provide a composite longitudinal vibration mechanical filter which has grooves defined in vibratable bodies by etching or the like at the same time that the vibratable bodies are fabricated, for thereby allowing the mass-produced vibratable bodies to vibrate at a highly accurate central frequency, and which effectively prevents frequency fluctuations from occurring for thereby enhancing and uniformizing passband characteristics, so that the mechanical filter can well be mass-produced, and a method of manufacturing such a composite longitudinal vibration mechanical filter.

Still another object of the present invention is to provide a composite longitudinal vibration mechanical filter which has through holes or blind holes defined in vibratable bodies by etching or the like at the same time that the vibratable bodies are fabricated, for thereby allowing the mass-produced vibratable bodies to vibrate at a highly accurate central frequency, and which effectively prevents frequency fluctuations from occurring for thereby enhancing and uniformizing passband characteristics, so that the mechanical filter can well be mass-produced, and a method of manufacturing such a composite longitudinal vibration mechanical filter.

Yet another object of the present invention is to provide a composite longitudinal vibration mechanical filter which has a highly accurate central frequency and has enhanced and uniformized characteristics inside and outside of the passband thereof, so that the mechanical filter can well be mass-produced, and a method of manufacturing such a composite longitudinal vibration mechanical filter.

Yet still another object of the present invention is to provide a composite longitudinal vibration mechanical filter which can suppress an unwanted vibratory wave that would otherwise be transmitted from an input longitudinally vibratable tuning bar via supporting elements and holding elements to an output longitudinally vibratable tuning bar, for thereby effectively reducing an undesired spurious response outside of the passband thereof, so that the passband characteristics are improved, and a method of manufacturing such a composite longitudinal vibration mechanical filter.

A further object of the present invention is to provide a composite longitudinal vibration mechanical filter which has a highly accurate central frequency and which can easily be adjusted after its characteristics have been measured, so that the passband characteristics will be improved, and a method of manufacturing such a composite longitudinal vibration mechanical filter.

A still further object of the present invention is to provide a composite longitudinal vibration mechanical filter which has a highly accurate central frequency and also has grooves defined in and shorter than vibratable bodies in order to improve passband characteristics thereof, and a method of manufacturing such a composite longitudinal vibration mechanical filter.

A yet further object of the present invention is to provide a composite longitudinal vibration mechanical filter which has a highly accurate central frequency and also has through and/or blind holes defined in vibratable bodies in order to improve passband characteristics thereof, and a method of manufacturing such a composite longitudinal vibration mechanical filter.

A yet still further object of the present invention is to provide a composite longitudinal vibration mechanical filter which has a highly accurate central frequency and also has improved characteristics inside and outside of the passband thereof, and a method of manufacturing such a composite longitudinal vibration mechanical filter.

It is also an object of the present invention to provide a method of manufacturing a composite longitudinal vibration mechanical filter including a plurality of vibratable bodies including input and output vibratable bodies with piezoelectric members superposed thereon, coupling elements by which the vibratable bodies are coupled to each other, supporting elements projecting respectively from the input and output vibratable bodies, and a holder to which the supporting elements are attached, the method comprising the steps of defining grooves in at least one of the vibratable bodies including the input and output vibratable bodies at the same time the vibratable bodies are fabricated, the grooves extending in the direction in which the vibratable bodies are longitudinally vibratable and being shorter than the length of the vibratable bodies, and superposing piezoelectric members fixedly on the input and output vibratable bodies in sandwiching relation thereto.

Another object of the present invention is to provide a method of manufacturing a composite longitudinal vibration mechanical filter including a plurality of vibratable bodies including input and output vibratable bodies with piezoelectric members superposed thereon, coupling elements by which the vibratable bodies are coupled to each other, supporting elements projecting respectively from the input and output vibratable bodies, and a holder to which the supporting elements are attached the method comprising the steps of defining through and/or blind holes in at least one of the vibratable bodies at the same time the vibratable bodies are fabricated, the holes having an opening size smaller than the wavelength of the longitudinal vibration of the vibratable bodies, and superposing piezoelectric members fixedly on the input and output vibratable bodies in sandwiching relation thereto.

Still another object of the present invention is to provide a method of manufacturing a composite longitudinal vibration mechanical filter for delivering out a supplied high-frequency signal in a predetermined frequency range, the composite longitudinal vibration mechanical filter including a plurality of vibratable bodies including input and output vibratable bodies with piezoelectric members superposed thereon, coupling elements by which the vibratable bodies are coupled to each other, supporting elements projecting respectively from the input and output vibratable bodies, and a holder to which the supporting elements are attached, the method comprising the step of fabricating the vibratable bodies which are longitudinally vibratable in a range close to a passband of the mechanical filter, and the coupling elements which are disposed between ends of the vibratable bodies an coupled thereto through flexural vibration, as a unitary structure from a single flat sheet according to a photolithographic process.

Yet another object of the present invention is to provide a composite longitudinal vibration mechanical filter for delivering out a supplied high-frequency signal in a predetermined frequency range, comprising a plurality of vibratable bodies including input and output vibratable bodies with piezoelectric members superposed thereon, coupling elements by which the vibratable bodies are coupled to each other, supporting elements projecting respectively from the input and output vibratable bodies, a holder to which ends of the supporting elements are attached, vibration absorbing body holders disposed between opposite ends of the supporting elements, and vibration absorbing bodies fixedly mounted on the vibration absorbing body holders.

Yet still another object of the present invention is to provide a composite longitudinal vibration mechanical filter for delivering out a supplied high-frequency signal in a predetermined frequency range, comprising a plurality of vibratable bodies including input and output vibratable bodies with piezoelectric members superposed thereon, coupling elements by which the vibratable bodies are coupled to each other, supporting elements projecting respectively from the input and output vibratable bodies, a holder to which ends of the supporting elements are attached, and resonant frequency adjusting fingers disposed on at least one of the vibratable bodies.

A further object of the present invention is to provide a composite longitudinal vibration mechanical filter for delivering out a supplied high-frequency signal in a predetermined frequency range comprising a plurality of vibratable bodies including input and output vibratable bodies with piezoelectric members superposed thereon, coupling elements by which the vibratable bodies are coupled to each other, supporting elements projecting respectively from the input and output vibratable bodies, a holder to which ends of the supporting elements are attached, and at least one of the vibratable bodies having a through groove, a blind groove, a straight groove, a curved groove, or a groove in the form of a combination of these grooves, defined therein and extending in a direction in which the vibratable body is longitudinally vibratable, the groove being shorter than the length of the vibratable body.

A still further object of the present invention is to provide a composite longitudinal vibration mechanical filter for delivering out a supplied high-frequency signal in a predetermined frequency range, comprising, a plurality of vibratable bodies including input and output vibratable bodies with piezoelectric members superposed thereon, coupling elements by which the vibratable bodies are coupled to each other, supporting elements projecting respectively from the input and output vibratable bodies, a holder to which ends of the supporting elements are attached, and at least on of the vibratable bodies having through holes and/or blind holes defined therein and having opening sizes smaller than the wavelength of longitudinal vibration of the vibratable body.

A yet still further object of the present invention is to provide a composite longitudinal vibration mechanical filter for delivering out a supplied high-frequency signal in a predetermined frequency range, comprising a plurality of vibratable bodies including input and output vibratable bodies for receiving and delivering a high-frequency signal, the vibratable bodies being longitudinally vibratable in a range close to a passband of the mechanical filter, piezoelectric members superposed on the input and output vibratable bodies, respectively, and having respective electrodes connected to conductors, and a plurality of coupling elements disposed between ends of the vibratable bodies and coupled thereto through flexural vibration.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 9 is a perspective views of a composite longitudinal vibration mechanical filter which is manufactured by the method shown in FIGS. 8(a), 8(b), 8(c) and 8(d);

DETAILED DESCRIPTION OF THE PREFERRED EMBODIMENTS

Figure 1:
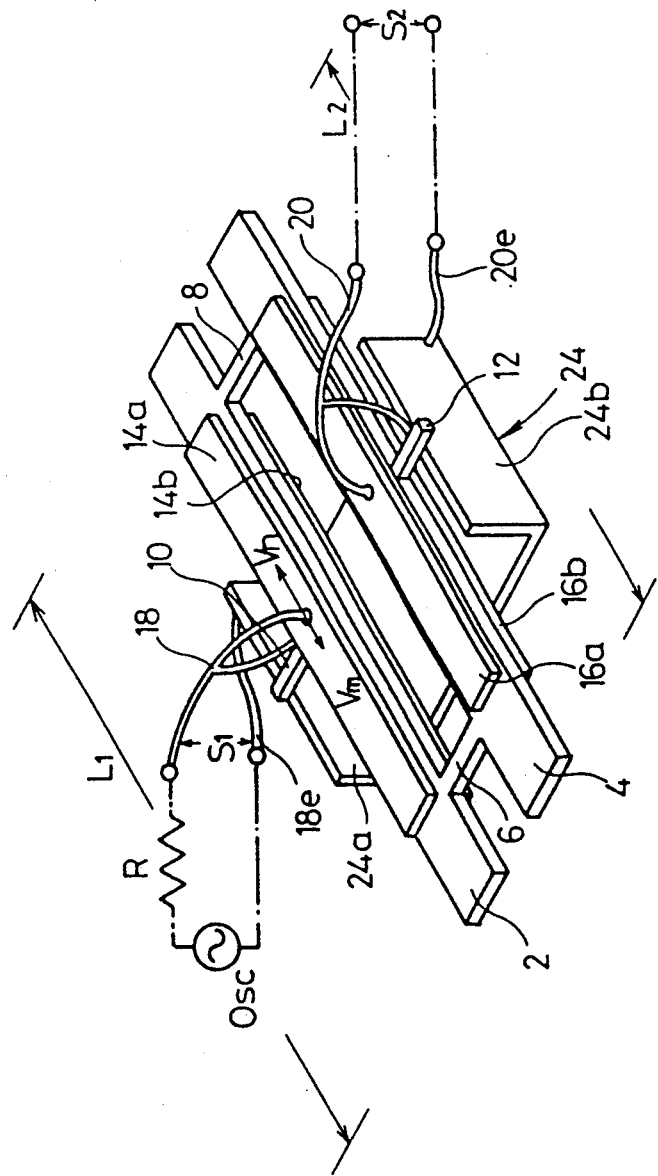
FIG. 1 is a perspective view of a conventional composite longitudinal vibration mechanical filter.

A composite longitudinal vibration mechanical filter manufactured by a method of the present invention will first be described with reference to FIG. 3. The mechanical filter shown in FIG. 3 has an input longitudinally vibratable tuning bar 32 and an output longitudinally vibratable tuning bar 34 which is identical in shape to the input longitudinally vibratable tuning bar 32. The input and output longitudinally vibratable tuning bars 32, 34 are disposed in one pane and joined to each other by a pair of thin coupling elements 36, 38 made of an identity elastic material. Supporting elements 40, 42 project outwardly from the centers of the input and output longitudinally vibratable tuning bars 32, 34. The input and output longitudinally vibratable tuning bars 32, 34 have respective through grooves 32a, 34a defined longitudinally centrally in and shorter than the longitudinally vibratable tuning bars 32, 34.

A pair of input piezoelectric ceramic members 44a, 44b is superposed on and fixed to the respective opposite surfaces of the input longitudinally vibratable tuning bar 32 by soldering or the like. Likewise, a pair of piezoelectric ceramic members 46a, 46b is superposed on and fixed to the respective opposite surfaces of the output longitudinally vibratable tuning bar 34 by soldering or the like. Electrodes (not shown) are metallized or otherwise deposited on the surfaces of the input piezoelectric ceramic members 44a, 44b and the output piezoelectric ceramic members 46a, 46b. The supporting elements 40, 42 have outer ends joined to inner opposite edges of a rectangular outer frame 50. The outer frame 50 and the input and output longitudinally vibratable tuning bars 32, 34 are disposed in the same plane. The input and output longitudinally vibratable tuning bars 32, 34, the coupling elements 36, 38, the supporting elements 40, 42, and the outer frame 50 are fabricated as a unitary structure from a single metal sheet by etching according to the photolithography which is well known in the art as a process for automatically mass-producing ICs with high accuracy.

A method of manufacturing the composite longitudinal vibration mechanical filter shown in FIG. 3 with the photolithographic process will now be described with reference to FIGS. 2(a) through 2(d).

Figure 2:
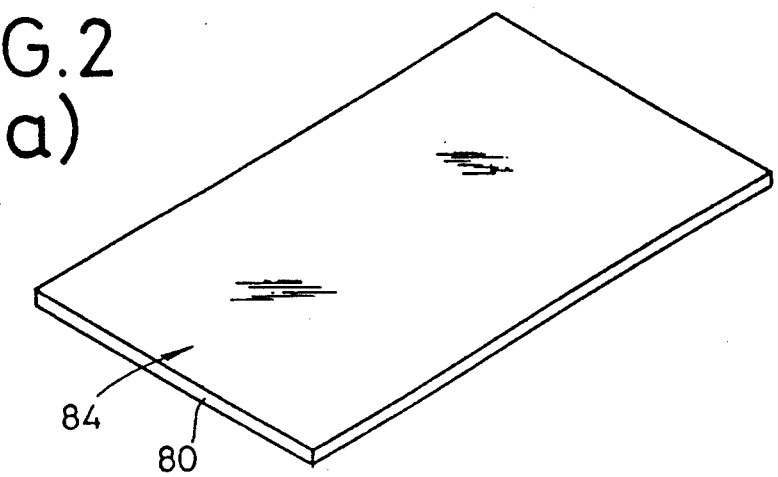
FIGS. 2(a), 2(b), 2(c) and 2(d) are perspective views showing the sequence of a method of manufacturing a composite longitudinal vibration mechanical filter according to an embodiment of the present invention.
Figure 2:
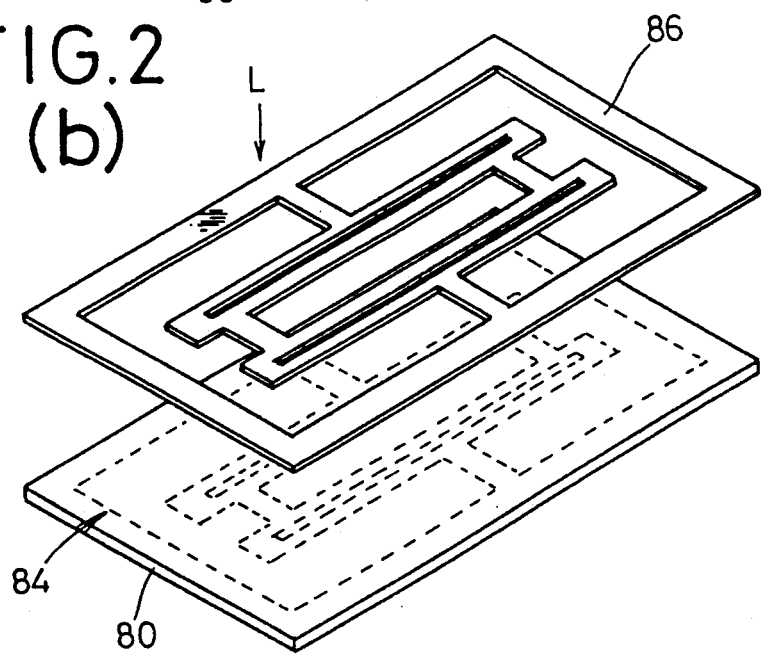
Figure 2:
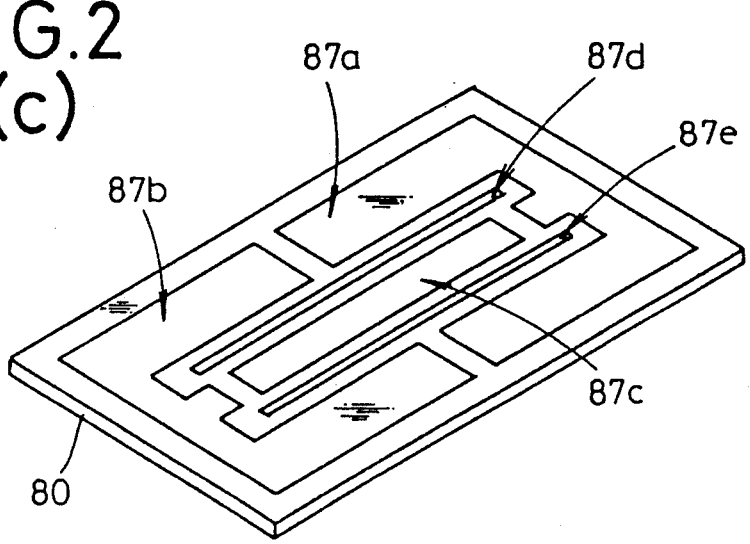
Figure 2:
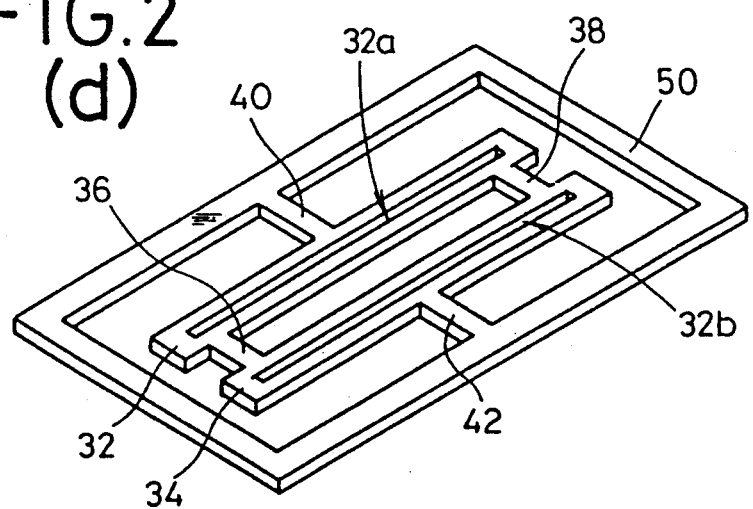

In a first step shown in FIG. 2(a), a photoresist layer 84 is coated on a flat metal sheet 80. The flat metal sheet 80 is designed such that it contains, in one plane, the longitudinally vibratable tuning bars 32, 34, which have respective grooves 32a, 32b defined centrally in and shorter than the tuning bars 32, 34, the grooves 32a, 32b extending in the direction in which longitudinal vibration is propagated, the coupling elements 36, 38, the supporting elements 40, 42, and the outer frame 50, (as seen in FIG. 3) and that it will have desired longitudinal vibration characteristics.

In a second step shown in FIG. 2(b), a radiation such as an X-ray $L_1$ for example, is applied to the flat metal sheet 80 through a mask pattern 86 which is of the same shape as the longitudinally vibratable tuning bars 32, 34, the grooves 32a, 34a, the coupling elements 36, 38, the supporting elements 40, 42, and the outer frame 50.

In a third step shown in FIG. 2(c), the flat metal sheet 80 is dipped in a solvent to develop the pattern corresponding to the mask pattern 86, and then photoresist layer areas 87a, 87b, 87c 87e which have been developed to the X-ray L are removed from the metal sheet 80.

In a fourth step shown in FIG. 2(d), the portions of the flat metal sheet 80 which correspond to the photoresist layer areas 87a, 87b, 87c, 87e that have been removed in the third step are removed by etching.

In this manner, the longitudinally vibratable tuning bars 32, 34 with the grooves 32a, 34a defined centrally therein in the longitudinal direction thereof and shorter than the tuning bars 32, 34, the coupling elements 36, 38, the supporting elements 40, 32, and the outer frame 50 are formed as a unitary structure.

Then, the input and output piezoelectric ceramic members 44a, 44b and 46a, 46b on which electrodes of gold or silver are metallized by vacuum evaporation or sputtering, are superposed on and fixed to the input and output longitudinally vibratable tuning bars 32, 34 by soldering.

Thereafter, a feed line 52 and a grounding line 52e (FIG. 3) are soldered to the input piezoelectric ceramic members 44a, 44b and the input longitudinally vibratable tuning bar 32, and similarly an outlet line 54 and a grounding line 54e are soldered to the output piezoelectric ceramic members 46a, 46b and the output longitudinally vibratable tuning bar 34

Operation of the composite longitudinal vibration mechanical filter shown in FIG. 3, which is manufactured by the above process, will be described below.

A high-frequency signal S., such for example as an intermediate-frequency signal having a frequency of 455 KHz generated by a frequency converter in a superheterodyne receiver or the like, is supplied from a signal source Osc to a resistor R and then to the feed line 52 and the grounding line 52e between the input piezoelectric ceramic members 44a, 44b and the input longitudinally vibratable tuning bar 32. The applied high-frequency signal $S_4$ generates an electric field having the same frequency as that of the signal $S_4$, between the electrodes and the input longitudinally vibratable tuning bar 32 which is electrically grounded. In response to the electric field thus generated, the input piezoelectric ceramic members 44a, 44b are mechanically deformed in the directions indicated by the arrows mi, mo in FIG. 3, and the input longitudinally vibratable tuning bar 32 resonates to produce a longitudinal wave having a frequency $F_4$ and a half wavelength which is equal to the length $L_4$ of the input longitudinally vibratable tuning bar 32. If the longitudinal wave is propagated along the input longitudinally vibratable tuning bar 32 at an average speed V, then the frequency $F_4$ is given by the following equation:

$$F_4 = V/(2L_4) \qquad (3)$$

The longitudinal vibration of the input longitudinally vibratable tuning bar 32 is mechanically coupled and propagated to the output longitudinally vibratable tuning bar 34 to the coupling elements 36, 38, causing the output longitudinally vibratable tuning bar 34 to resonate or vibrate longitudinally at a frequency $F_5$ and with a half wavelength equal to the length $L_5$ of the tuning bar 34. If the longitudinal wave is propagated along the output longitudinally vibratable tuning bar 34 at an average speed V, then the frequency $F_5$ is given by the following equation:

$$F_5 = V/(2L_5) \qquad (4)$$

The longitudinal vibration of the output longitudinally vibratable tuning bar 34 produces a voltage between the electrodes on the output piezoelectric ceramic members 6a, 46b. The produced voltage is then led out between the outlet line 54 and the grounding line 54e as an output signal $S_5$, e.g., an intermediate-frequency signal $S_5$ having a frequency of 455 KHz, with a sharp frequency characteristic curve created by the transmission of the longitudinal vibration, i.e., with narrow-band frequency characteristics.

As can be understood from the equations (3) and (4) above, the resonant frequency F. of the input longitudinally vibratable tuning bar 32 and the resonant frequency $F_5$ of the output longitudinally vibratable tuning bar 34 are inversely proportional to the lengths $L_4$, $L_5$ of the respective tuning bars 32, 34. The accuracy of the lengths $L_4$, $L_5$ is dependent on the photolithographic technology which is employed to fabricate the longitudinally vibratable tuning bars 32, 34. The accuracy of the lengths $L_4$, $L_5$ cannot have a sufficiently small error because of the thickness of the tuning bars 32, 34. Generally, the dimensional accuracy $\delta L$ of the length of the tuning bars 32, 34 is expressed by:

$$\delta L = \pm 1.5/10 \cdot t \qquad (5)$$

where t is the thickness of the tuning bars 32, 34. The dimensional accuracy $\delta L$ does not vary greatly since the input and output longitudinally vibratable tuning bars 32, 34 are simultaneously fabricated as a unitary structure by etching.

The grooves 32a, 34a defined in the longitudinally vibratable tuning bars 32, 34 of FIG. 3 will hereinafter be described. Since the grooves 32a, 34a provide the same advantages for the input and output longitudinally vibratable tuning bars 32, 34, one longitudinally vibratable tuning bar will be described below.

It is assumed that a longitudinally vibratable tuning bar which has a width W has a central longitudinal groove having a width M and a length $L_M$, and that the material of which the longitudinally vibratable tuning bar is made has an average mass $\rho$.

Figure 3:
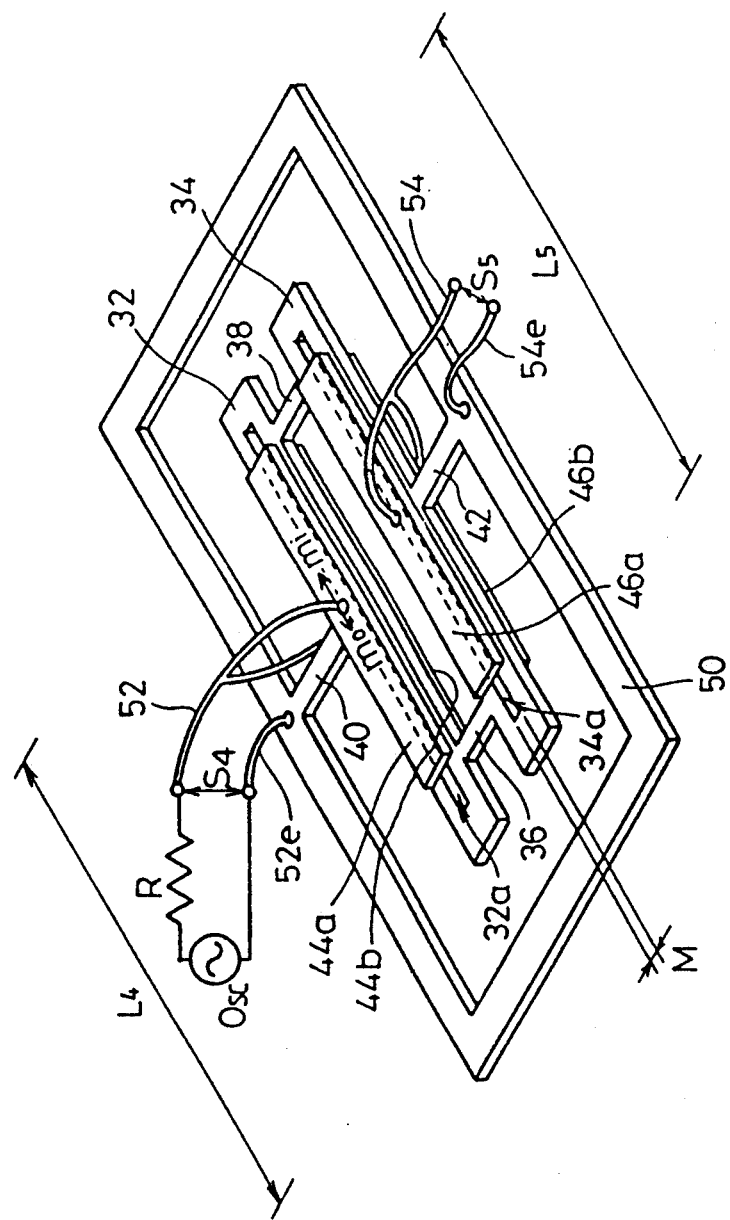
FIGS. 3 and 4 are perspective views of composite longitudinal vibration mechanical filters which are manufactured by the method shown in FIGS. 2(a), 2(b), 2(c) and 2(d)

Since the groove defined centrally in FIG. 3 in the longitudinally vibratable tuning bar extends in the direction in which longitudinal vibration is propagated therealong, the groove does not interfere with operation of the longitudinally vibratable tuning bar. The cross-sectional area Sa of the longitudinally vibratable tuning bar where the groove is present and longitudinal vibration takes place is small because of the groove. The cross-sectional area Sa is given by:

$$Sa = (W - M) \cdot t \qquad (6)$$

The cross-sectional area Sb of the longitudinally vibratable tuning bar where no groove is present and longitudinal vibration takes place is given by:

$$Sb = W \cdot t \qquad (7)$$

If the width W of the longitudinally vibratable tuning bar is reduced by the dimensional accuracy $\delta L$ due to an etching error (overetching), then the groove is widened by $\delta L$. At this time, the cross-sectional areas Sa, Sb are expressed as follows:

$$Sa = \{(W - \delta L) - (M + \delta L)\} \cdot t \qquad (8)$$
$$= (W - M - 2\delta L) \cdot t$$
$$Sb = (W - \delta L) \cdot t \qquad (9)$$

The length L of the longitudinally vibratable tuning bar now becomes (L - $\delta L$).

The effect of an added mass on the longitudinally vibratable tuning bar will be considered below.

(1) When $\delta L = 0$, a mass represented by $\{M \cdot (L - L_M) \cdot t \cdot \rho\}$ when $L_M$ is the length of the groove and commensurate with the width of the longitudinally vibratable tuning bar is added to the distal end of the longitudinally vibratable tuning bar that has the cross-sectional area $(W - M) \cdot t\}$, and the length of the longitudinally vibratable tuning bar is indicated by L.

(2) When $\delta L \neq 0$, a mass represented by $\{(M + \delta L)(L - L_M) \cdot t \cdot \rho$ and commensurate with the width of the longitudinally vibratable tuning bar and a mass represented by $\{(-\delta L) \cdot W \cdot t \cdot \rho\}$ and commensurate with the length of the longitudinally vibratable tuning bar are added to the distal end of the longitudinally vibratable tuning bar that has the cross-sectional area $\{(W - M - 2\delta L) \cdot t\}$, and the length of the longitudinally vibratable tuning bar is indicated by L (through the length is indicated by L $- \delta L$, the dimensional accuracy $\delta L$ is considered as an added mass).

As a result of comparison between the equations in the cases (1) and (2) above, the mass $\delta \rho$ which is newly added when $\delta L \neq 0$ is given by the following equation:

$$\delta \rho = \delta L \cdot \{(L - L_M) - W\} \cdot t \cdot \rho \cdot \{(W - M) \cdot t \cdot P\} / \{(W - M - 2\delta L) \cdot t \cdot \rho\} \qquad (10)$$

If the dimensions of the longitudinally vibratable tuning bar are selected such that $(L - L_M) - W = 0$, i.e., $$L_M = L - W \qquad (11)$$

then $\delta \rho = 0$ even when $\delta[L \neq 0$.

Therefore, the mass of the longitudinally vibratable tuning bar does not vary, and hence the resonant frequency of the longitudinally vibratable tuning bar does not vary.

As described above, the grooves 32a, 34a which extend in he direction in which longitudinal vibration is propagated are defined centrally in the input and output longitudinally vibratable tuning bars 32, 34. Even if the longitudinally vibratable tuning bars 32, 34 have different lengths due to an etching error which is caused when they are fabricated as a unitary structure, the central frequency of the composite longitudinal vibration mechanical filter does not vary and the bandpass characteristics thereof are not degraded because of the grooves 32a, 34a which are defined by etching in the longitudinaly vibratable tuning bars 32, 34 at the same time that they are fabricated.

Another composite longitudinal vibration mechanical filter which includes five longitudinally vibratable tuning bars and achieves a greater amount of attenuation outside of the passband, i.e., provides a sharper frequency characteristic curve, will be described with reference to FIG. 4.

The composite longitudinal vibration mechanical filter comprises input and output longitudinally vibratable tuning bars 70, 78, three longitudinally vibratable tuning bars 72, 74, 76 disposed between the longitudinally vibratable tuning bars 70, 78, and coupling elements 82a, 82b, 84a, 84b, 86a, 86b, 88a, 88b by which the longitudinally vibratable tuning bars 70, 72, 74, 76, 78 are joined together. The longitudinally vibratable tuning bars 70, 72, 74, 76, 78 have respective longitudinal grooves 70a, 72a, 74a, 76a, 78a defined centrally therein.

Supporting elements 90, 92 project outwardly centrally from the input and output longitudinally vibratable tuning bars 70, 78, and have outer ends secured to inner opposite edges of an outer frame 93. A pair of input piezoelectric ceramic members 94a, 94b is superposed on and fixed to the opposite surfaces of the input longitudinally vibratable tuning bar 70, and a pair of output piezoelectric ceramic members 96a, 96b is superposed on and fixed to the opposite surfaces of the output longitudinally vibratable tuning bar 78.

Figure 4:
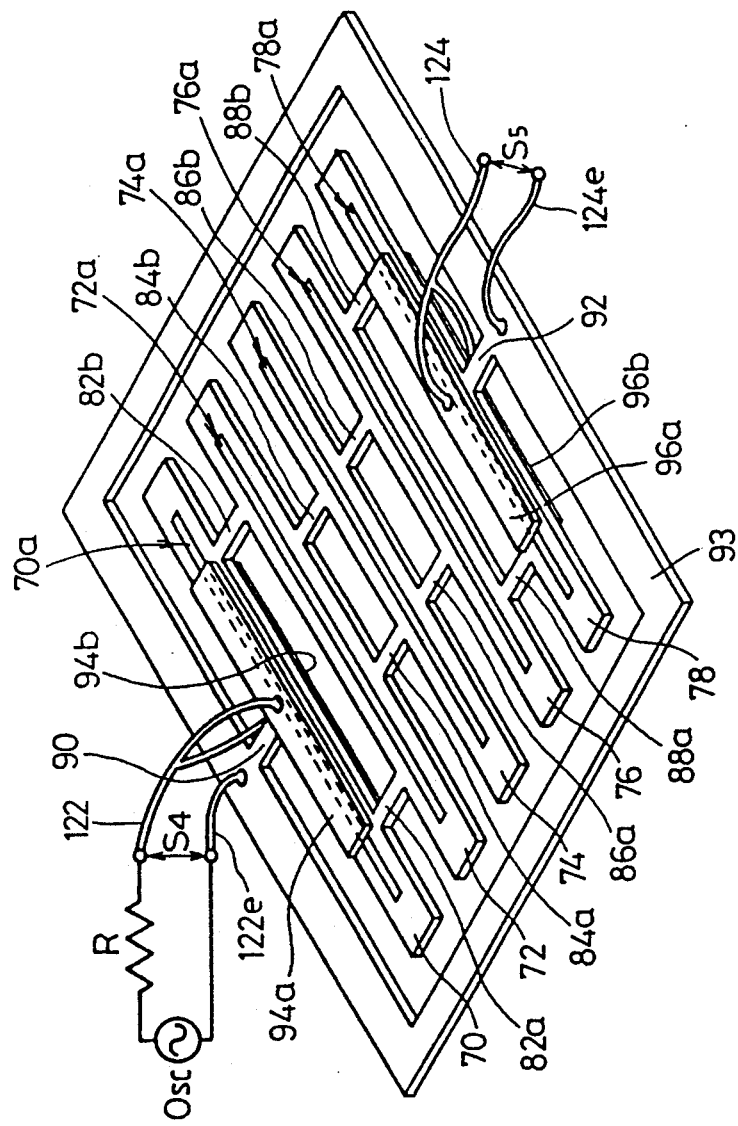
Figure 5:
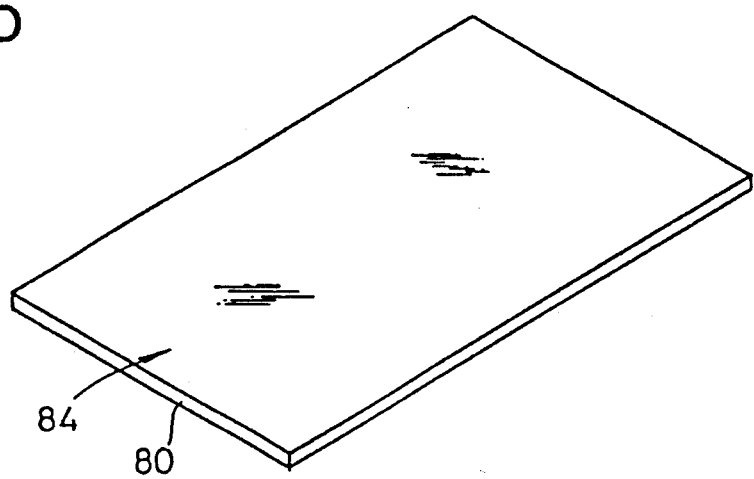
FIGS. 5(a), 5(b), 5(c) and 5(d) are perspective views showing the sequence of a method of manufacturing a composite longitudinal vibration mechanical filter according to another embodiment of the present invention.
Figure 5:
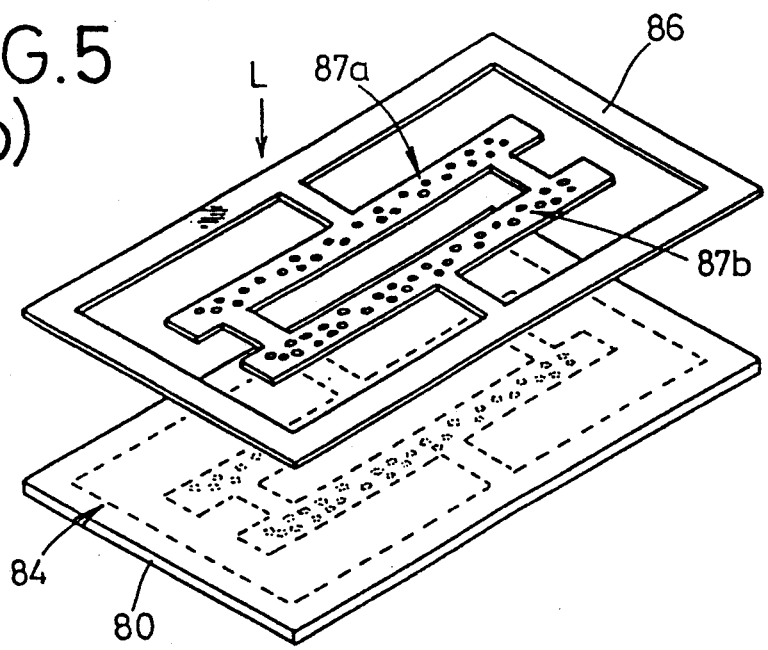
Figure 5:
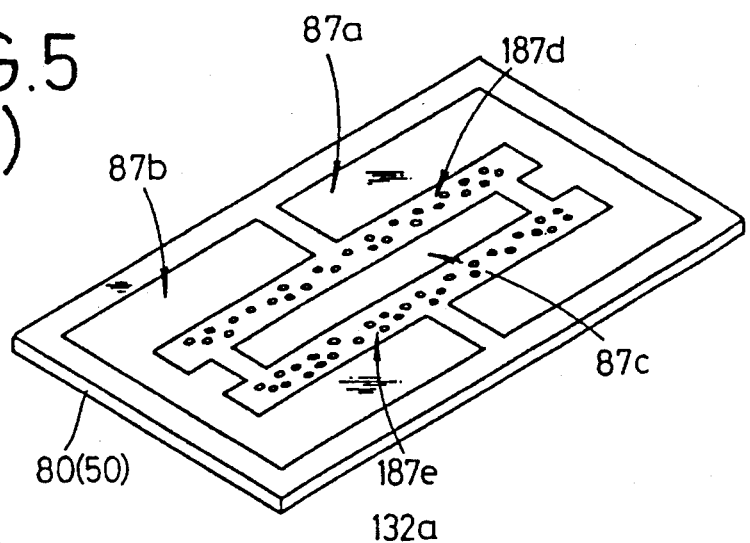
Figure 5:
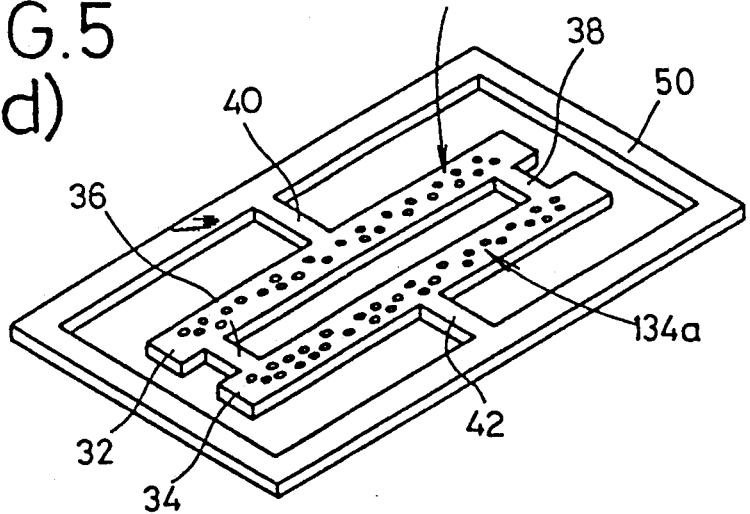

The composite longitudinal vibration mechanical filter shown in FIG. 4 is manufactured and operates in basically the same manner, and offers substantially the same advantages, as the composite longitudinal vibration mechanical filter shown in FIG. 3.

However, use of the plural longitudinally vibratable tuning bars 70, 72, 74, 76, 78 is effective in greatly reducing dimensional variations of these tuning bars, and in improving the passband characteristics of the mechanical filter.

In the embodiments shown in FIGS. 3 and 4, the grooves 32a, 34a and 70a, 72a, 74a, 76a, 78a are defined through the longitudinally vibratable tuning bars 32, 34 and 70, 72, 74, 76, 78, respectively. However, the invention is not limited to those grooves. Blind grooves may be defined in these longitudinally vibratable tuning bars, or two or more grooves may be defined in each of the longitudinally vibratable tuning bars. A groove or grooves may be defined in one or some of the longitudinally vibratable tuning bars 32, 34 and 70, 72, 74, 76, 78. A curved or discontinuous groove or grooves may be defined in the longitudinally vibratable tuning bars. The input signal is fed in by leads 122 and 122e and the output signal appears across leads 124 and 124e.

In the manufacturing method shown in FIGS. 2(a) through 2(d), a photoresist layer which has been exposed to an X-ray is removed, which is known as the negative process. However, the positive process may be employed to fabricate the composite longitudinal vibration mechanical filter.

As described above, the method of the present invention includes the first step of defining grooves in at least the input and output vibratable bodies along the direction in which the vibratable bodies vibrate, at the same time that the vibratable bodies are fabricated, the grooves being shorter than the length of the vibratable bodies, and the second step of superposing and fixing the piezoelectric members to the input and output vibratable bodies in sandwiching relation. The grooves are defined in the vibratable bodies by etching or the like at the same time that the vibratable bodies are fabricated. The vibratable bodies as they are mass-produced have a highly accurate central frequency, and are effectively prevented from dimensionally varying, so that the composite longitudinal vibration mechanical filter has improved passband characteristics and can well be mass-produced.

A composite longitudinal vibration mechanical filter manufactured by a method according to another embodiment of the present invention will be described with reference to FIGS. 6(a) and 6(b). The composite longitudinal vibration mechanical filter illustrated in FIGS. 6(a) and 6(b) is of essentially the same configuration as the composite longitudinal vibration mechanical filter shown in FIG. 3, except that the longitudinally vibratable tuning bars have plural through holes 132a, 134a defined therein and have opening sizes which are small as compared with the wavelength of the longitudinal vibration of the tuning bars. The other structural components are the same as those of the composite longitudinal vibration mechanical filter shown in FIG. 3. Therefore, those identical components are denoted by identical reference numerals, and will not be described in detail.

A method of manufacturing the composite longitudinal vibration mechanical filter shown in FIGS. 6(a) and 6(b) according to the photolithographic process is illustrated in FIGS. 5(a), 5(b), 5(c) and 5(d). The through holes 132a, 134a are defined in the input and output longitudinally vibratable tuning bars 32, 34 according to the photolithographic process at the same time that the longitudinally vibratable tuning bars 32, 34 are fabricated. Therefore, a mask pattern 86 used has through holes 87a, 87b corresponding to the through holes 132a, 134a to be defined. In the third step shown in FIG. 5(c), photoresist layer areas 87a, 87b, 87c, 87d, and 87e to be removed are formed on the metal sheet 80. The other steps are same as those shown in FIGS. 2(a) 2(b), 2(c) and 2(d). Those identical components are denoted by identical reference numerals, and will not be described in detail. W is the width of the tuning bar and $L_M$ is the length of the groove and/or the length where the through holes exist.

As can be understood from the equations (3) and (4) above, the resonant frequency $F_4$ of the input longitudinally vibratable tuning bar 32 and the resonant frequency $F_5$ of the output longitudinally vibratable tuning bar 34 are inversely proportional to the lengths $L_4$, $L_5$ of the respective tuning bars 32, 34. The accuracy of the lengths $L_4$, $L_5$ is dependent on the photolithographic technology which is employed to fabricate the longitudinally vibratable tuning bars 32, 34. The accuracy of the lengths $L_4$, $L_5$ cannot have a sufficiently small error because of the thickness of the tuning bars 32, 34. Generally, the dimensional accuracy $\delta L$ of the length of the tuning bars 32, 34 is expressed by:

$$\delta L = \pm 1.5/10 \cdot t \qquad (12)$$

where t is the thickness of the tuning bars 32, 34. The dimensional accuracy $\delta L$ does not vary greatly since the input and output longitudinally vibratable tuning bars 32, 34 with the through holes 132a, 134a are simultaneously fabricated as a unitary structure by etching. The signs of the equation (12) remain the same as those of the equation (5).

The through holes 132a, 134a defined in the longitudinally vibratable tuning bars 32, 34 will hereinafter be described.

It is assumed that the longitudinally vibratable tuning bars 32, 34 have a length L ($L_4$, $L_5$), the through holes have a width M (see FIG. 6(b)), the distribution ratio of the through holes 132a, 134a in the input and output longitudinally vibratable tuning bars 32, 34 (the ratio of the sum of the areas of the through holes to the entire area of the central portion of the longitudinally vibratable tuning bar) is indicated by $\gamma$, the input and output longitudinally vibratable tuning bars 32, 34 have a width W, and the length of the longitudinally vibratable tuning bars 32, 34 where the through holes 132a, 134a are present (in the direction in which the longitudinal vibration is propagated) is indicated by $L_M$, and also that the material of which the longitudinally vibratable tuning bars 32, 34 are made has an average mass $\rho$.

Since the through holes 132a, 134a defined in the input and output longitudinally vibratable tuning bars 32, 34 are sufficiently small as compared with the wavelength of the longitudinal vibration, the through holes 132a, 134a do not interfere with operation of the input and output longitudinally vibratable tuning bars. The cross-sectional area Sc of the longitudinally vibratable tuning bars where the through holes 132a, 134a are present and longitudinal vibration takes place is small because of the through holes 132a, 134a. The cross-sectional area Sc is given by:

$$S_c = (W - \gamma M) \cdot t \quad (13)$$

The cross-sectional area Sd of the longitudinally vibratable tuning bars where no through holes are present and longitudinal vibration takes place is given by:

$$S_d = W \cdot t \quad (14)$$

If the width W of the longitudinally vibratable tuning bars is reduced by the dimensional accuracy $\delta L$ due to an etching error (overetching), then each of the through holes 132a, 134a is widened by $\delta L$. At this time, the cross-sectional areas Sc, Sd are expressed as follows:

$$S_c = \{(W - \delta L) - \gamma(M + \delta L)\} \cdot t$$
$$= \{W - \gamma M - (1 + \gamma)\delta L\} \cdot t \quad (15)$$
$$S_d = (W - \delta L) \cdot t \quad (16)$$

The length L ($L_4$, $L_5$) of the input and output longitudinally vibratable tuning bars 32, 34 now becomes $(L - \delta L)$.

The effect of an added mass on the input and output longitudinally vibratable tuning bars 32, 34 will be considered below.

(1) When $\delta L = 0$, a mass represented by $\{\gamma M \cdot (L - L_M) \cdot t \cdot \rho\}$ and commensurate with the width W of the longitudinally vibratable tuning bars is added to the distal ends of the input and output longitudinally vibratable tuning bars 32, 34 that have the cross-sectional area $(W - \gamma M) \cdot t\}$, and the length of the input and output longitudinally vibratable tuning bars 32, 34 is indicated by L.

(2) When $\delta L \neq 0$, a mass represented by $\{(\gamma M + \gamma \delta L) \cdot (L - L_M) \cdot t \cdot \rho\}$ and commensurate with the width W of the longitudinally vibratable tuning bars and a mass represented by $\{(-\delta L) \cdot W \cdot t \cdot \rho\}$ and commensurate with the length L of the longitudinally vibratable tuning bars are added to the distal ends of the input and output longitudinally vibratable tuning bars 32, 34 that have the cross-sectional area $\{(W - \gamma M - (1 + \gamma)\delta L) \cdot t\}$, and the length of the longitudinally vibratable tuning bars is indicated by L (though the length is indicated by $L - \delta L$, the dimensional accuracy $\delta L$ is considered as an added mass).

As a result of comparison between the equations in the cases (1) and (2) above, the mass $\delta \rho$ which is newly added when $\delta L \neq 0$ is given by the following $$\delta \rho = \delta L \cdot \{\}(L - L_M) - W\} \cdot t \cdot \rho \cdot \{(W - \gamma M) \cdot t \cdot \rho\} / \{(W - \gamma M - (1 + \gamma)\delta L) \cdot t \cdot \rho\} \quad (17)$$

If the dimensions of the longitudinally vibratable tuning bars are selected such that $Y(L - L_M) - W = 0$, i.e., $$L_M = L - W/\gamma \quad (18)$$

then $\delta \rho = 0$ even when $\delta L \neq 0$.

Therefore, the mass of the longitudinally vibratable tuning bars does not vary, and hence the resonant frequency of the input and output longitudinally vibratable tuning bars does not vary.

As described above, the through holes 132a, 134a which have an opening size sufficiently smaller than the wavelength of the longitudinal vibration is defined in the input and output longitudinally vibratable tuning bars 32, 34. Even if the longitudinally vibratable tuning bars 32, 34 do not have a sufficient dimensional accuracy, i.e., they have different lengths due to an etching error which is caused when they are fabricated as a unitary structure, the central frequency of the composite longitudinal vibration mechanical filter does not vary and the bandpass characteristics thereof are not degraded because of the through holes 32a, 34a which are defined by etching in the longitudinally vibratable tuning bars 32, 34 at the same time that they are fabricated.

Another composite longitudinal vibration mechanical filter which includes five longitudinally vibratable tuning bars and achieves a greater amount of attenuation outside of the passband, i.e., provides a sharper frequency characteristic curve, will be described with reference to FIG. 7.

Figure 7:
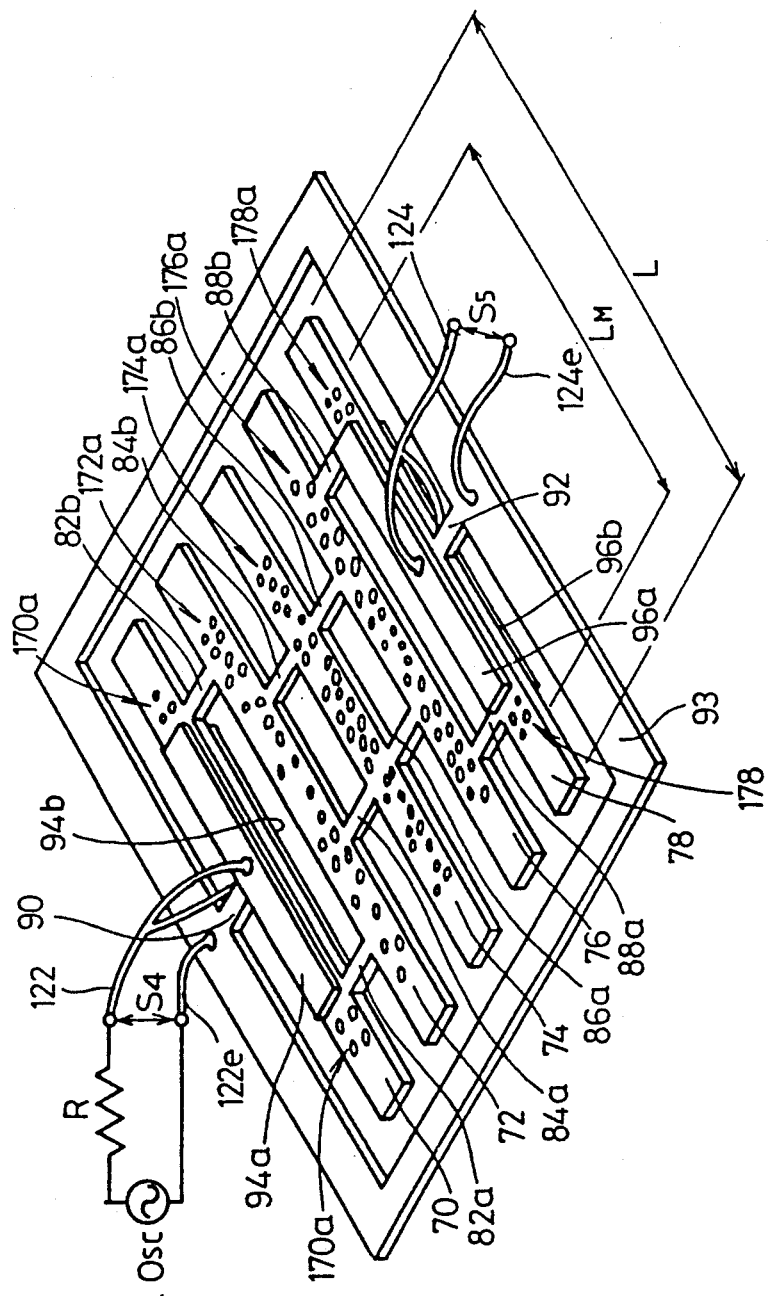
FIG. 7 is a perspective view of another composite longitudinal vibration mechanical filter which is manufactured by the method shown in FIGS. 5(a), 5(b), 5(c) and 5(d)
Figure 8A:
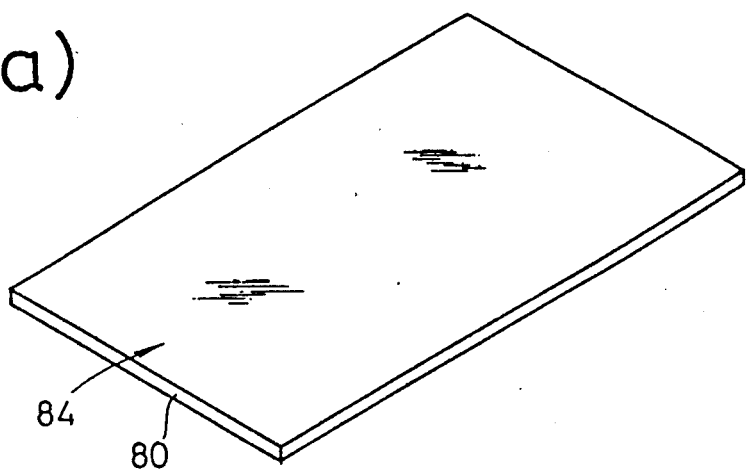
FIGS. 8(a), 8(b), 8(c) and 8(d) are perspective views showing the sequence of a method of manufacturing a composite longitudinal vibration mechanical filter according to still another embodiment of the present invention.
Figure 8B:
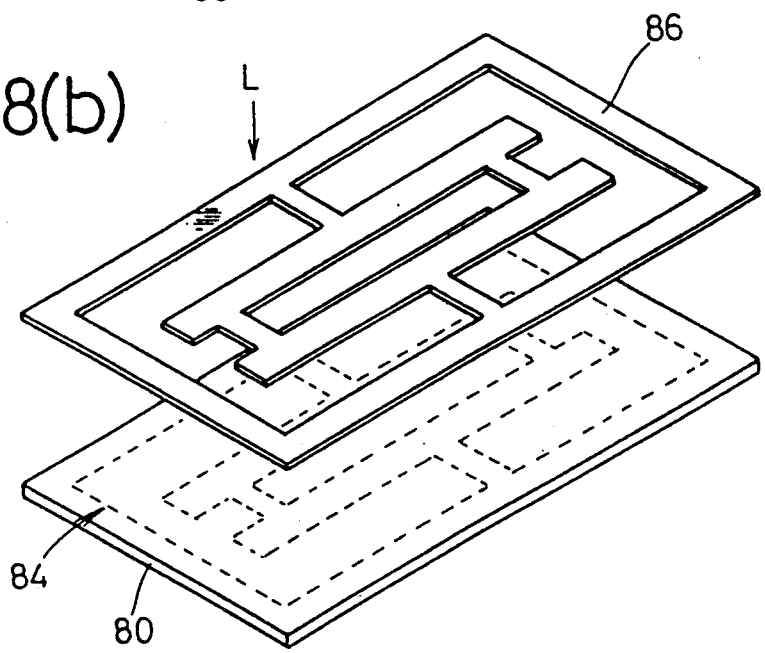
Figure 8C:
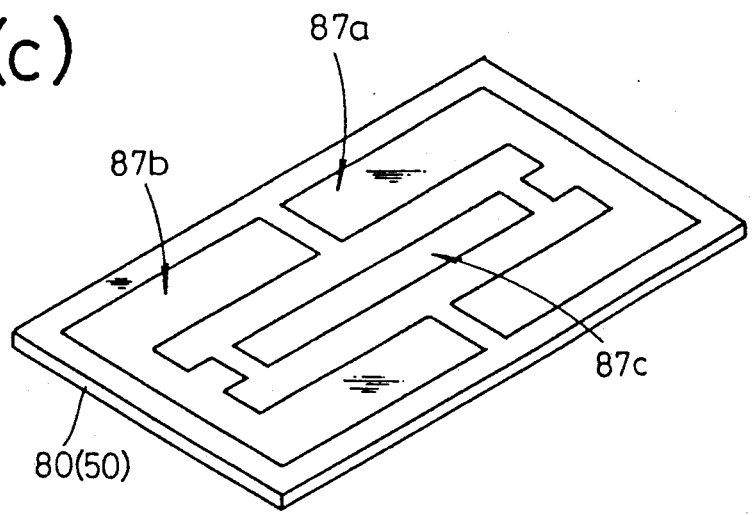
Figure 8D:
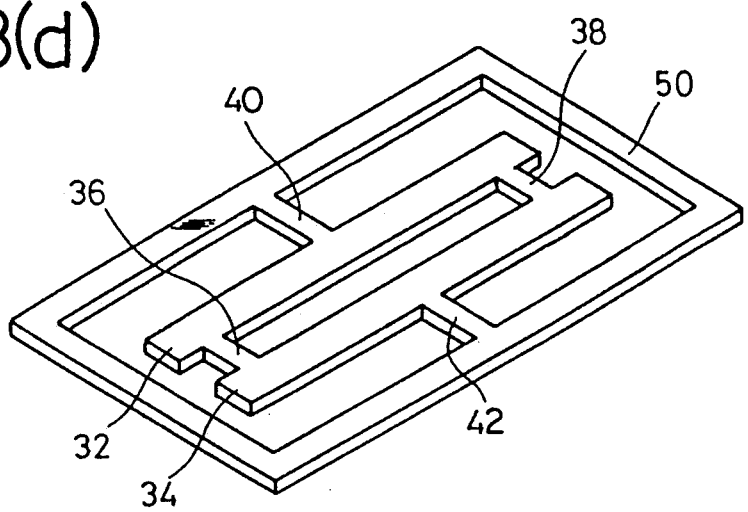

The composite longitudinal vibration mechanical filter shown in FIG. 7 is substantially identical in construction to the composite longitudinal vibration mechanical filter shown in FIG. 4, except that the longitudinally vibratable tuning bars have plural through holes 170a, 172a, 174a, 176a, 178a defined therein and having opening sizes which are small as compared with the wavelength of the longitudinal vibration of the tuning bars. The input signal is fed in via leads 122 and 122e and the output signal appears across leads 124, and 124b. The other structural components are the same as those of the composite longitudinal vibration mechanical filter shown in FIG. 4. Therefore, those identical components are denoted by identical reference numerals, and will not be described in detail.

Figure 6:
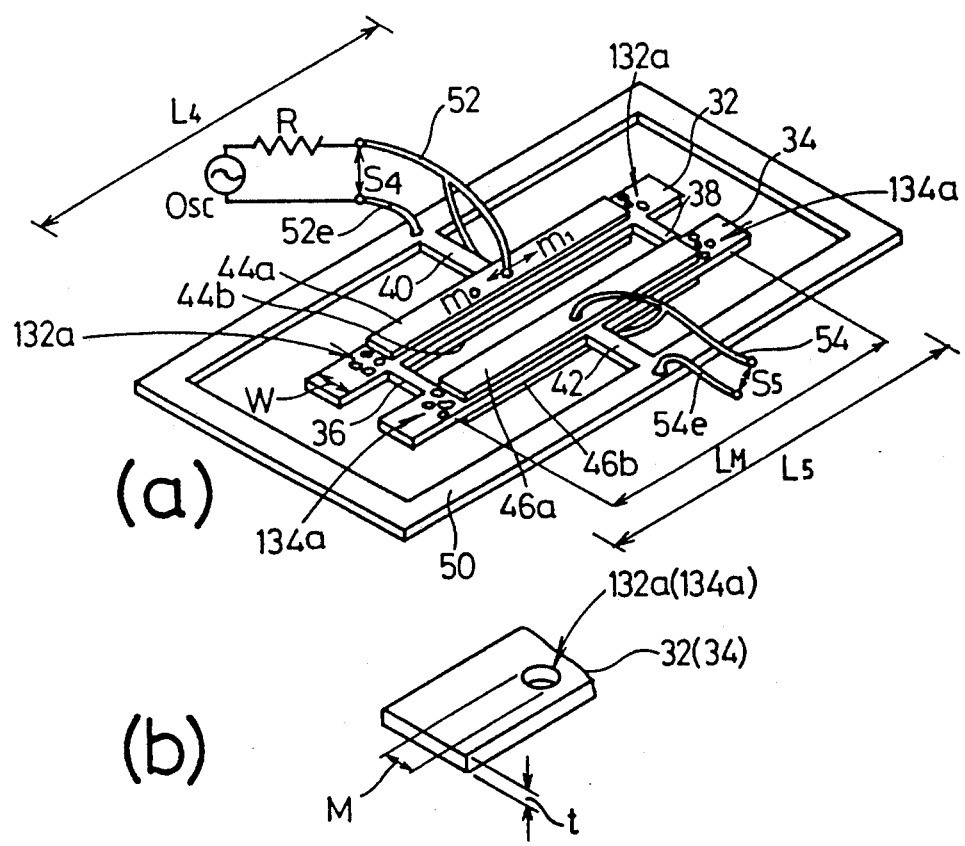
FIG. 6(a) is a perspective view of a composite longitudinal vibration mechanical filter which is manufactured by the method shown in FIGS. 5(a), 5(b), 5(c) and 5(d)
FIG. 6(b) is an enlarged fragmentary perspective view of a portion of the composite longitudinal vibration mechanical filter shown in FIG. 6(a)

The composite longitudinal vibration mechanical filter shown in FIG. 7 is manufactured by the same photolithographic process and operates in the same manner as the composite longitudina vibration mechanical filter shown in FIG. 6.

However, use of the plural longitudinally vibratable tuning bars 70, 72, 74, 76, 78 is effective in greatly reducing dimensional variations of these tuning bars, and in improving the passband characteristics of the mechanical filter.

In the embodiments shown in FIGS. 6 and 7, the holes 32a, 34a and 170a, 172a, 174a, 176a, 178a are defined through the longitudinally vibratable tuning bars 32, 34 and 70, 72, 74, 76, 78, respectively. However, the invention is not limited to those through holes. Through holes and/or blind holes or recesses may be defined in these longitudinally vibratable tuning bars, or two or more holes may be defined in one or some of the longitudinally vibratable tuning bars 32, 34, and 70, 72, 74, 76, 78.

As described above, the embodiments shown in FIGS. and 7 reside in that through holes and/or blind holes may be defined in at least one of the vibratable bodies including the input and output vibratable bodies.

With the above arrangement, the composite longitudinal vibration mechanical filter has a highly accurate central frequency, improved passband characteristics, reduced characteristic variations between the longitudinally vibratable tuning bars, provides uniform characteristics when it is mass-produced, and is of improved quality.

FIG. 9 shows a composite longitudinal vibration mechanical filter which is manufactured by a method according to still another embodiment of the present invention. The composite longitudinal vibration mechanical filter has coupling elements 36, 38 which are positioned near the distal ends of the input and output longitudinally vibratable tuning bars 32, 34, i.e., in regions where the longitudinally vibratable tuning bars are displaced to a large extent in the direction in which the longitudinal vibration takes place. The vibration is propagated (coupled) to the coupling elements 36, 38 as a transverse wave, i.e., so-called flexural vibration, so that spurious responses are reduced and the passband characteristics are improved.

The composite longitudinal vibration mechanical filter shown in FIG. 9 is substantially identical to the composite longitudinal vibration mechanical filter shown in FIG. 3, except that grooves 32a, 32a are not defined. Those parts in FIG. 9 which are identical to those of FIG. 3 are designated by identical reference numerals, and will not be described in detail.

The composite longitudinal vibration mechanical filter shown in FIG. 9 is manufactured by the photolithographic process in substantially the same manner as shown in FIGS. 2(a), 2(b), 2(c) and 2(d).

Reduction of spurious responses with the structure shown in FIG. 9 will be described below.

The input and output longitudinally vibratable tuning bars 32, 34 are displaced to a greater extent at their distal ends in the direction in which the longitudinal vibration takes place. Displacement of the longitudinally vibratable tuning bars 32, 34 in a direction normal to the longitudinal direction is greater at the center of the longitudinally vibratable tuning bars 32, 34. The displacement by the longitudinal vibration of the input longitudinally vibratable tuning bar 32 in the direction of the longitudinal vibration, and the displacement thereof in the direction normal to the longitudinal vibration, are transmitted (coupled) to the output longitudinally vibratable tuning bar 34 via the coupling elements 36, 38.

At this time, not only the displacement normal to the longitudinal vibration is coupled to the longitudinal vibration of the output longitudinally vibratable tuning bar 34 via the coupling elements 36, 38, but also vibration in another mode is coupled to the longitudinal vibration of the output longitudinally vibratable tuning bar 34. Therefore, spurious responses are of a large value, deteriorating the filter characteristics. The vibration normal to the longitudinal vibration is propagated mainly as a longitudinal wave in the coupling elements 36, 38, and the displacement in the direction of the longitudinal vibration produces smaller spurious responses than the displacement normal to the longitudinal vibration as it is coupled to the longitudinal vibration of the output longitudinally vibratable tuning bar 34 via the coupling elements 36, 38. The longitudinal vibration is propagated as flexural vibration in the coupling elements 36, 38.

The coupling elements 36, 38 are disposed in the regions where the displacement in the direction of the longitudinal vibration is large, near the distal ends of the input and output longitudinally vibratable tuning bars 32, 34. The input and output longitudinally vibratable tuning bars 32, 34 are coupled to each other by the flexural vibration via the coupling elements 36, 38. Accordingly, spurious responses are reduced, and the passband characteristics are improved.

The displacement of the input longitudinally vibratable tuning bar 32 in the direction of the longitudinal vibration is larger at its distal ends, and is represented as a function of the position in the direction of the longitudinal vibration. In order to provide desired frequency characteristics and reduce dimensional variations of the longitudinally vibratable tuning bars, it is necessary to uniformize the amount of coupling of the output longitudinally vibratable tuning bar 34 to the input longitudinally should be positioned relatively to the input longitudinally vibratable tuning bar 32. The coupling elements 36, 38 should be positioned relatively to the input longitudinally vibratable tuning bar 32 as constantly as possible. More specifically, the relative position between the input and output longitudinally vibratable tuning bars 32, 34 and the coupling elements 36, 38 can be rendered constant by fabricating the input and output longitudinally vibratable tuning bars 32, 34 and the coupling elements 36, 38 from a single sheet by etching according to the photolithographic process. FIGS. 8(a) through 8(d) show a method of manufacturing the composite longitudinal vibration mechanical filter shown in FIG. 9, the method being essentially the same as the method shown in FIGS. 2(a) through 2(d).

Figure 10:
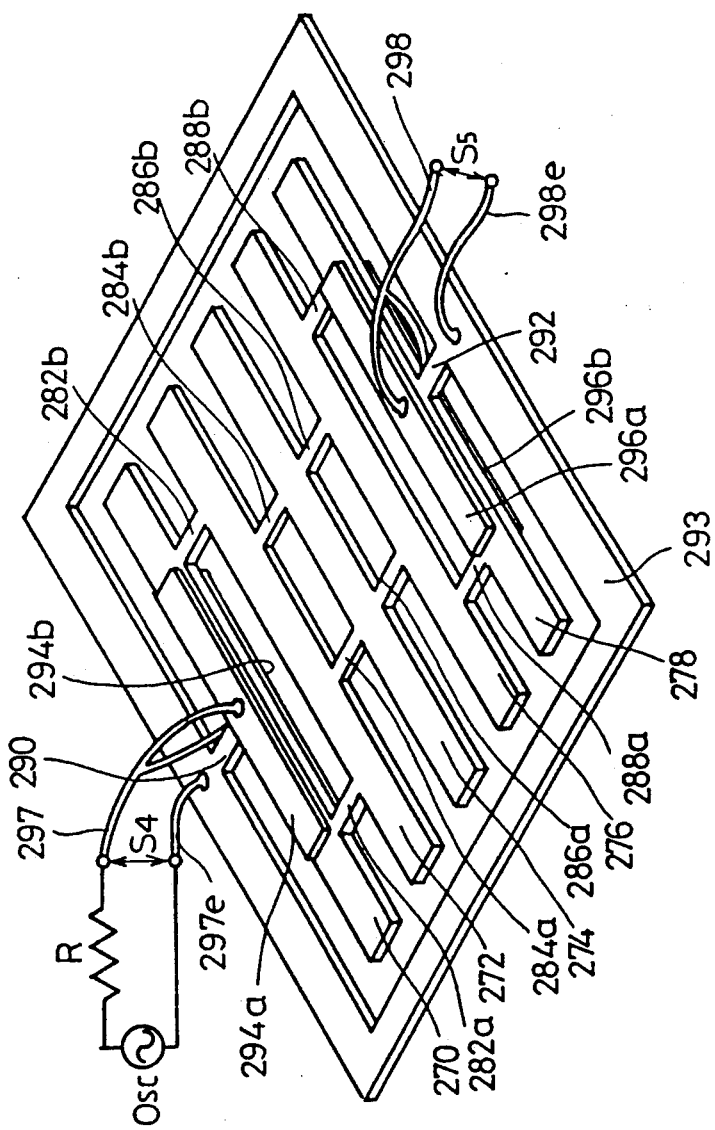
FIG. 10 is a perspective view of another composite longitudinal vibration mechanical filter which is manufactured by the method shown in FIGS. 8(a), 8(b), 8(c) and 8(d)

Another composite longitudinal vibration mechanical filter which comprises five longitudinally vibratable tuning bars and provides increased frequency attenuation outside of the passband is illustrated in FIG. 10.

The composite longitudinal vibration mechanical filter shown in FIG. 10 comprises input and output longitudinally vibratable tuning bars 270, 278, three longitudinally vibratable tuning bars 272, 274, 276 disposed between the longitudinally vibratable tuning bars 270, 278, and coupling elements 282a, 282b, 284a, 284b, 286a, 286b, 288a, 288b by which the longitudinally vibratable tuning bars 270, 272, 274, 276, 278 are joined together.

Supporting elements 290, 292 project outwardly centrally from the input and output longitudinally vibratable tuning bars 270, 278, and have outer ends secured to inner opposite edges of an outer frame 293. A pair of input piezoelectric ceramic members 294a, 294b is superposed on and fixed to the opposite surfaces of the input longitudinally vibratable tuning bar 270, and a pair of output piezoelectric ceramic members 296a, 296b is superposed on and fixed to the opposite surfaces of the output longitudinaly vibratable tuning bar 278. The composite longitudinal vibration mechanical filter also has a feed line 297 and a grounding line 297e which are connected respectively to the input piezoelectric ceramic members 294a, 294b, and an outlet line 298 and a grounding line 298e which are connected respectively to the output piezoelectric ceramic members 296a, 296b.

The composite longitudinal vibration mechanical filter shown in FIG. 10 is manufactured and operates in basically the same manner as the composite longitudinal vibration mechanical filter shown in FIG. 9.

With the plural longitudinaly vibratable tuning bars 270, 222, 274, 276, 278 are employed, dimensional variations of these tuning bars are reduced, and the passband characteristics of the mechanical filter are improved.

According to the above embodiments shown in FIGS. 9 and 10, the composite longitudinal vibration mechanical filter for delivering a supplied high-frequency signal in a predetermined frequency range includes a plurality of longitudinally vibratable bodies including input and output vibratable bodies for receiving and delivering the high-frequency signal, the vibratable bodies being vibratable in a range close to the passband of the mechanical filter, a plurality of piezoelectric members superposed on the input and output vibratable bodies and including electrodes to which conductors are connected, a plurality of coupling elements disposed between ends of the vibratable bodies and coupling them through flexural vibration, a plurality of supporting members projecting from the input and output vibratable bodies, and a holder member which holds the vibratable bodies including the input and output vibratable bodies with the supporting members projecting therefrom.

With such an arrangement, the composite longitudinal vibration mechanical filter has a highly accurate central frequency, improved passband characteristics, provides uniform characteristics when it is mass-produced, and is of improved quality.

Figure 11:
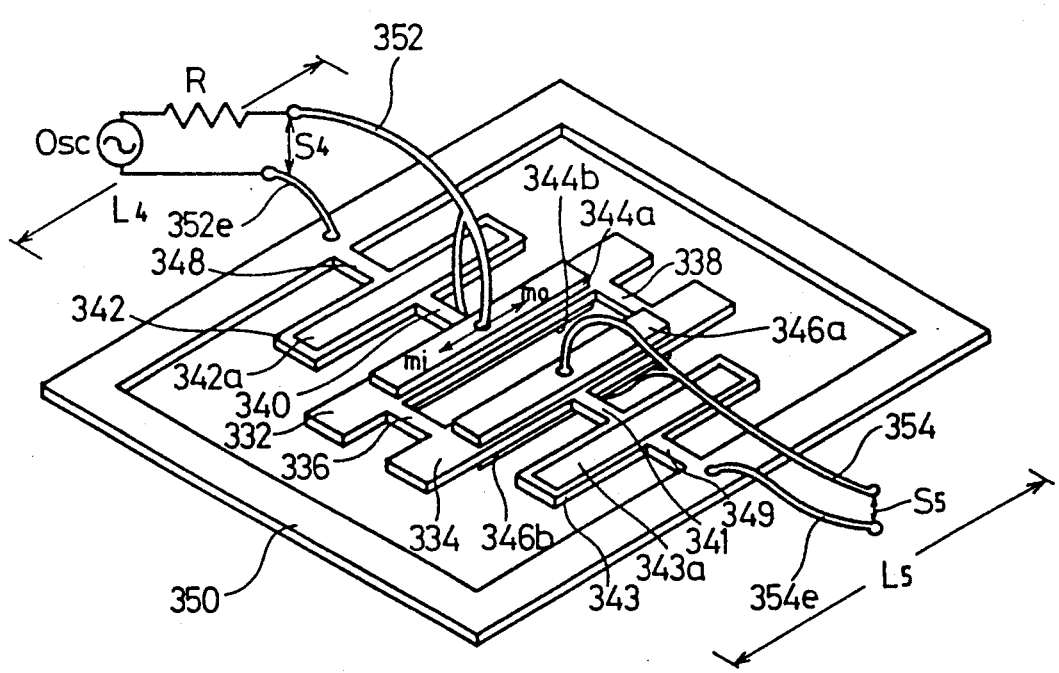
FIG. 11 is a perspective view of a composite longitudinal vibration mechanical filter according to another embodiment of the present invention.

FIG. 11 shows a composite longitudinal vibration mechanical filter according to another embodiment of the present invention. The composite longitudinal vibration mechanical filter shown in FIG. 11 comprises an input longitudinally vibratable tuning bar 332 and a output longitudinally vibratable tuning bar 334 which is identical in shape to the tuning bar 332. The input and output longitudinally vibratable tuning bars 332, 334 lie in one plane, and joined to each other by coupling elements 336, 338 which are made of an identity elastic material. Supporting elements 340, 341 project outwardly from the centers of the input and output longitudinally vibratable tuning bars 332, 334. The supporting elements 340, 341 have outer ends to which there are connected respective vibration absorbing body holders 342, 343 with vibration absorbing bodies 342a, 343a secured respectively thereto. The vibration absorbing bodies 342a, 343a, which are made of a viscoelastic material such as silicone rubber, for example, converts transmitted vibration to Joule heat. A pair of input piezoelectric ceramic members 344a, 344b is superposed on and fixed to the respective opposite surfaces of the input longitudinally vibratable tuning bar 332 by soldering or the like. Likewise, a pair of output piezoelectric ceramic members 346a, 346b is superposed on and fixed to the respective opposite surfaces of the output longitudinally vibratable tuning bar 334 by soldering or the like. Electrodes (not shown) are metallized or otherwise deposited on the surfaces of the input piezoelectric ceramic members 344a, 344b and the output piezoelectric ceramic members 346a, 346b.

The supporting elements 340, 342 have outer ends joined to inner opposite edges of a rectangular outer frame 350. The outer frame 350 and the input and output longitudinally vibratable tuning bars 332, 334 are disposed in the same plane. The input and output longitudinally vibratable tuning bars 332, 334, the coupling elements 336, 338, the supporting elements 340, 342, and the outer frame 350 are fabricated as a unitary structure from a single metal sheet by etching according to the photolithography, for example.

A feed line 352 and a grounding line 352e for supplying a high-frequency signal are connected to the input piezoelectric ceramic members 344a, 344b, respectively, and an outlet line 354 and a grounding line 354e for delivering out an output signal are connected to the output piezoelectric ceramic members 346a, 346b, respectively.

The composite longitudinal vibration mechanical filter of the above construction operates as follows: When a high-frequency signal is applied to the input piezoelectric ceramic members 344a, 344b, the support element 348 the input longitudinally vibratable tuning bar 332 is longitudinally vibrated in the directions indicated by the arrows mi, mo. Such longitudinal vibration is transmitted through the coupling elements 336, 338 to the output longitudinally vibratable tuning bar 334. The frequencies of the longitudinal vibration of the input and output longitudinally vibratable tuning bars 332, 334 are expressed by the previously described equations (3) and (4). At the same time, the input longitudinally vibratable tuning bar 332 is also vibrated in directions normal to the directions indicated by the arrows mi, mo, i.e., in the axial or longitudinal direction of the supporting element 40. This vibration is propagated in the supporting element 340 and absorbed by the vibration absorbing body 342a fixedly mounted on the vibration absorbing body holder 342. Any vibration which has not been absorbed by the vibration absorbing body 342a is propagated through the outer frame 350 and then the supporting element 349 joined to the output longitudinally vibratable tuning bar 334. Such propagated vibration is then absorbed by the vibration absorbing body 343a mounted on the vibration absorbing body holder 343 to which the supporting element 349 is fixed. As a result, the unwanted vibration is minimized before it is transmitted to the output longitudinally vibratable tuning bar 334.

The undesired vibratory wave emitted from the input longitudinally vibratable tuning bar 332 toward the output longitudinally vibratable tuning bar 334 is effectively absorbed by the vibration absorbing bodies 342a, 343a mounted respectively on the vibration absorbing body holders 342, 343, so that unwanted spurious responses outside of the passband will be reduced.

Still another composite longitudinal vibration mechanical filter which includes five longitudinally vibratable tuning bars and achieves a greater amount of attenuation outside of the passband will be described with reference to FIG. 12.

Figure 12:
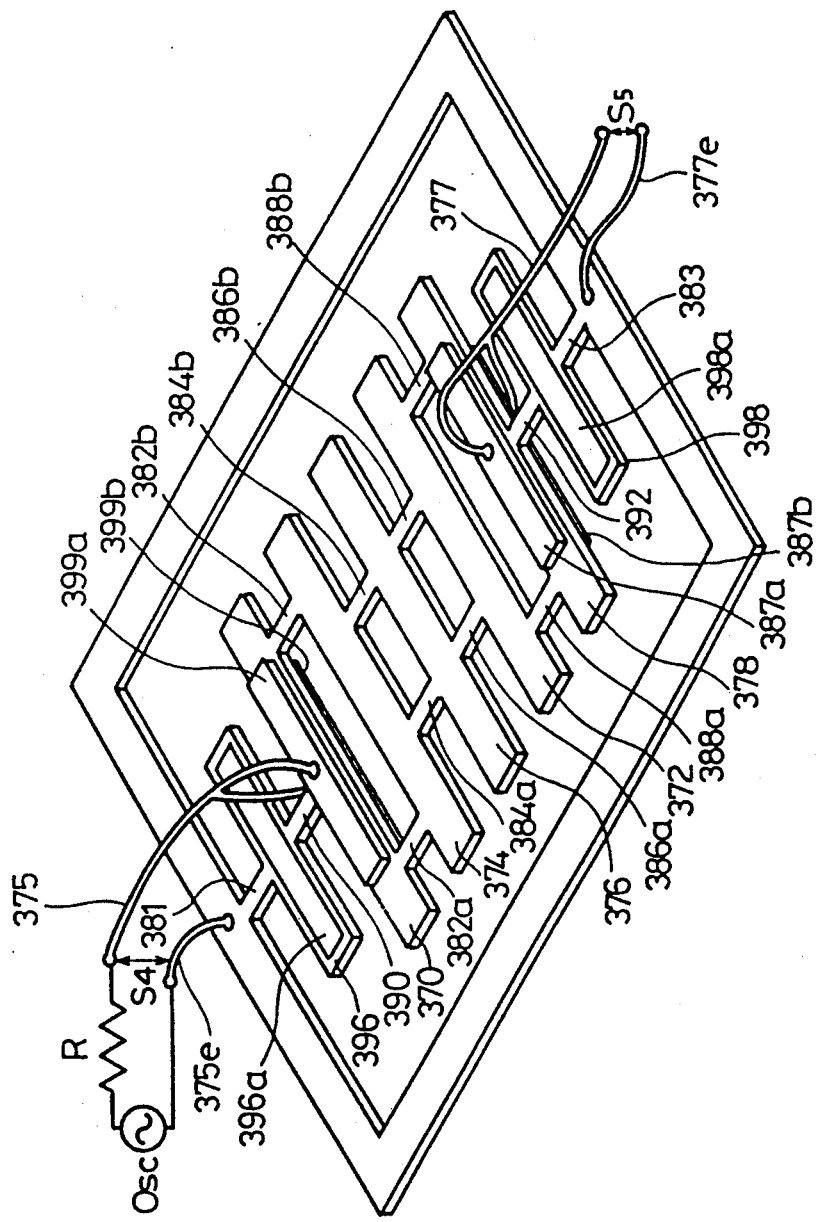
FIG. 12 is a perspective view of a composite longitudinal vibration mechanical filter according to a modification of the mechanical filter shown in FIG. 11.

The composite longitudinal vibration mechanical filter illustrated in FIG. 12 comprises input and output longitudinally vibratable tuning bars 370, 378, three longitudinally vibratable tuning bars 372, 374, 376 disposed between the longitudinally vibratable tuning bars 370, 378, and coupling elements 382a, 382b, 384a, 384b, 386a, 386b, 388a, 388b by which the longitudinally vibratable tuning bars 370, 372, 374, 376, 378 are joined together.

Supporting elements 390, 392 project outwardly centrally from the input and output longitudinally vibratable tuning bars 370, 378, and have outer ends secured to respective vibration absorbing body holders 396, 398 on which respective vibration absorbing bodies 396a, 398a are fixedly mounted. A pair of input piezoelectric ceramic members 399a, 399b is superposed on and fixed to the opposite surfaces of the input longitudinally vibratable tuning bar 370, and a pair of output piezoelectric ceramic members 387a, 387b is superposed on and fixed to the opposite surfaces of the output longitudinally vibratable tuning bar 378. Supporting elements 381, 383 which project outwardly from the vibration absorbing body holders 396, 398 have outer ends attached to inner confronting edges of a rectangular outer frame 385. A feed line 375 and a grounding line 375e are connected respectively to the input piezoelectric ceramic members 399a, 399b, and an outlet line 377 and a grounding line 377e are connected respectively to the output piezoelectric ceramic members 387a, 387b.

The composite longitudinal vibration mechanical filter shown in FIG. 12 operates in basically the same manner as the composite longitudinal vibration mechanical filter shown in FIG. 11.

However, use of the plural longitudinally vibratable tuning bars 370, 372, 374, 376, 378 is effective in increasing the amount of attenuation outside of the passband of the mechanical filter, and the vibration absorbing bodies 396a, 398a absorb undesired vibratory waves, thus suppressing spurious responses to a greater extent.

Figure 13:
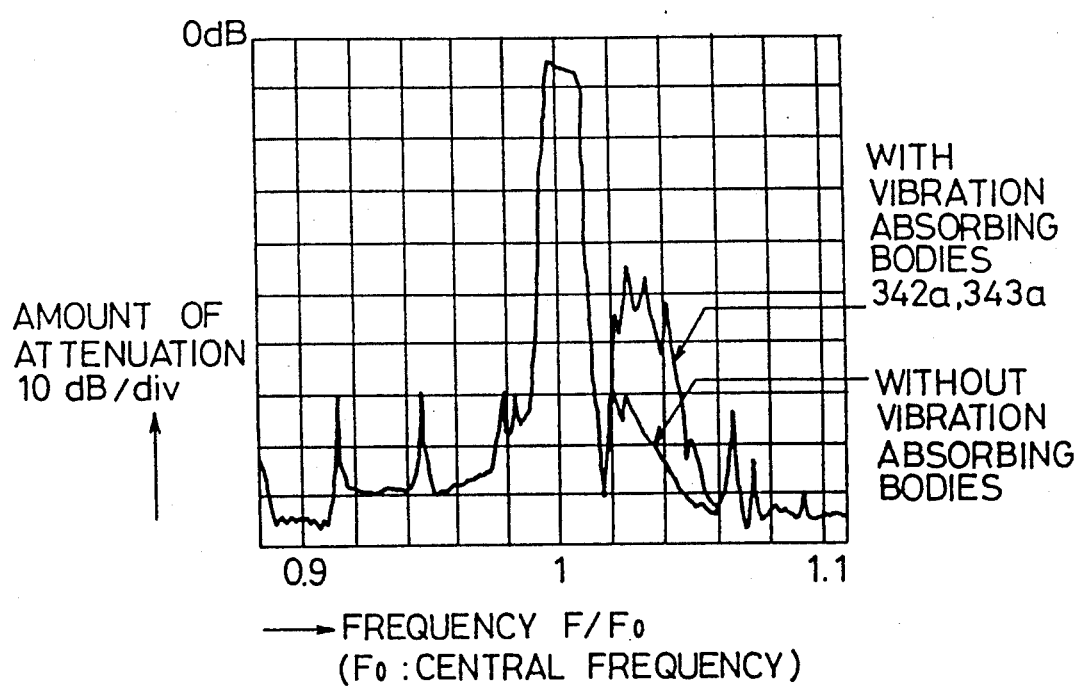
FIG. 13 is a diagram showing the passband characteristics of the mechanical filter shown in FIG. 11.

FIG. 13 shows the passband characteristics of the mechanical filter shown in FIG. 11. A study of FIG. 13 indicates that the unwanted vibration is effectively absorbed by the vibration absorbing bodies 342a, 343a, so that undesired spurious responses outside of the passband are reduced. In FIG. 13, the amount of attenuation outside of the passband is 40 dB without any vibration absorbing bodies, but is increased to 65 dB with the vibration absorbing bodies 342a, 343a employed.

In the embodiments shown in FIGS. 11 and 12, the vibration absorbing body holders 342, 343, 396, 398 and the vibration absorbing bodies 342a, 343a, 396a, 398a are rectangular in shape when viewed in plan, and the vibration absorbing bodies 342a, 343a, 396a, 398a are mounted on the upper surfaces of the vibration absorbing body holders 342, 343, 396, 398. However, the present invention is not limited to the illustrated structures. The vibration absorbing bodies 342a, 343a, 396a, 398a may be disposed on both surfaces of the vibration absorbing body holders 342, 343, 396, 398. The vibration absorbing body holders may be of a circular or rod shape, or may be of a hollow structure for holding many vibration absorbing bodies therein, or may be of a combination of these configurations.

As described above, the composite longitudinal vibration mechanical filters shown in FIGS. 11 and 12 include vibration absorbing body holders disposed between the opposite ends of supporting elements, and vibration absorbing bodies fixedly mounted on the vibration absorbing body holders, respectively. Unwanted vibratory waves transmitted from the input longitudinally vibratable tuning are through the supporting elements and the holders toward the output longitudinally vibratable tuning bar are effectively absorbed and suppressed by the vibration absorbing bodies, thereby reducing undesired spurious response outside of the passband of the mechanical filter and improving the passband characteristics thereof.

Figure 14:
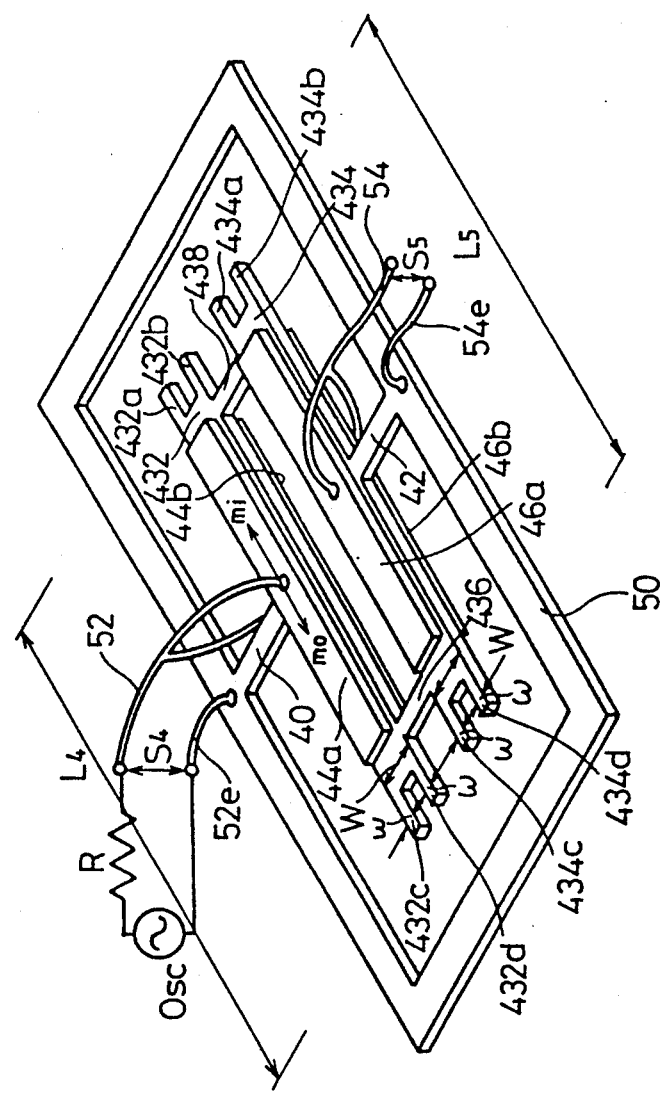
FIG. 14 is a perspective view of a composite longitudinal vibration mechanical filter according to a further embodiment of the present invention.

FIG. 14 shows a composite longitudinal vibration mechanical filter according to a further embodiment of the present invention. The composite longitudinal vibration mechanical filter shown in FIG. 14 comprises an input longitudinally vibratable tuning bar 432 and an output longitudinally vibratable tuning bar 434 which is identical in shape to the tuning bar 432. The input and output longitudinally vibratable tuning bars 432, 434 lie in one plane, and joined to each other by narrow coupling elements 436, 438 which are made of an identity elastic material. The input and output longitudinally vibratable tuning bars 432, 434 have resonant frequency adjusting fingers 432a, 432b, 432c, 432d and 434a, 34b, 434c, 434d on their distal ends. The other structural details of the composite longitudinal vibration mechanical filter shown in FIG. 14 are the same as those of the mechanical filter shown in FIG. 9. Those parts shown in FIG. 14 which are identical to those shown in FIG. 9 are denoted by identical reference numerals, and will not be described.

Operation of the composite longitudinal vibration mechanical filter illustrated in FIG. 14 is as follows:

As can be understood from the equations (3) and (4) referred to previously, the resonant frequency $F_4$ of the input longitudinally vibratable tuning bar 432 and the resonant frequency $F_5$ of the output longitudinally vibratable tuning bar 434 are determined by the lengths $L_4$, $L_5$ of the respective tuning bars 432, 434. The accuracy of the lengths $L_4$, $L_5$ is dependent on the photolithographic technology which is employed to fabricate the longitudinally vibratable tuning bars 432, 434. The accuracy of the lengths $L_4$, $L_5$ cannot sufficiently be high because of the thickness of the tuning bars 432, 434. Generally, the dimensional accuracy $\delta L$ of the length of the tuning bars 432, 434 is expressed by:

$$\delta L = \pm 1.5/10 \cdot t \quad (19)$$

where t is the thickness of the tuning bars 332, 334. Therefore, the resonant frequencies $F_4$, $F_5$ of the input and output longitudinally vibratable tuning bars 432, 434 cannot be higher than the accuracies which are expressed by the following equations:

$$\delta L_4 = \pm 1.5/10 \cdot t/L_4 \quad (20)$$

$$\delta L_5 = \pm 1.5/10 \cdot t/L_5 \quad (21)$$

The thickness t is generally selected to be in the range of from 0.01 L to 0.1 L. Consequently, the accuracy of the frequency given by the equations (20) and (21) ranges from $\pm 0.0015 \cdot F$ to $\pm 0.015 \cdot F$ (F represents the central frequency of the mechanical filter). This frequency accuracy is however not sufficient for an intermediate-frequency filter for use in communication devices.

The resonant frequency adjusting fingers 432a, 432, 432c, and 432d on the ends of the input longitudinally vibratable tuning bar 432 and the resonant frequency adjusting fingers 434a, 434b, 434c 434d on the output longitudinally vibratable tuning bar 434 operate as follows:

Each of the resonant frequency adjusting fingers 432a, 432(b), 432(c) and 432d and 434a, 434(b), 434(c) and 434d has a width ω which is smaller than the width W of each of the input and output longitudinally vibratable tuning bars 432, 434. The narrower resonant frequency adjusting fingers 432a, 432(b), 432(c) and 434d and 434a, 434(b), 434(c) and 434d do not serve as propagation paths for the longitudinal vibration propagated in the input and output longitudinally vibratable tuning bars 432, 434, but as added masses attached to the propagation paths which are provided by the input and output longitudinally vibratable tuning bars 432, 434. The added masses act to reduce the resonant frequencies of the input and output longitudinally vibratable tuning bars 432, 434, and have a magnitude of approximately ω/W, which is relatively small as compared with a frequency reduction caused by the addition of a propagation path. The resonant frequencies of the input and output longitudinally vibratable tuning bars 432, 434 can easily be adjusted by altering the dimensions of the resonant frequency adjusting fingers 432a, 432(b), 432(c) and 432d and 434a 434(b), 434(c) and 434d, though the amount of frequency adjustment that can be achieved is very small.

The frequency adjustment may be carried out as follows: The composite longitudinal vibration mechanical filter is operated, and its passband characteristics and reflecting characteristics are measured. Deviations of the resonant frequencies $F_4$, $F_5$ of the input and output longitudinally vibratable tuning bars 432, 434 are then estimated from the measured values. The dimensions, such as the length, thickness, and width, of one or more of the resonant frequency adjusting fingers 432a, 432(b), 432(c) and 432d and 434a 434(b), 434(c) and 434d are reduced in proportion to the estimated frequency deviations. The resonant frequency adjusting fingers 432a, 432(b), 432(cand 432d and 434a, 434(b), 434(c) and 434d should be of such a large size, in advance, that they can be reduced in dimensions for frequency adjustment.

Figure 15:
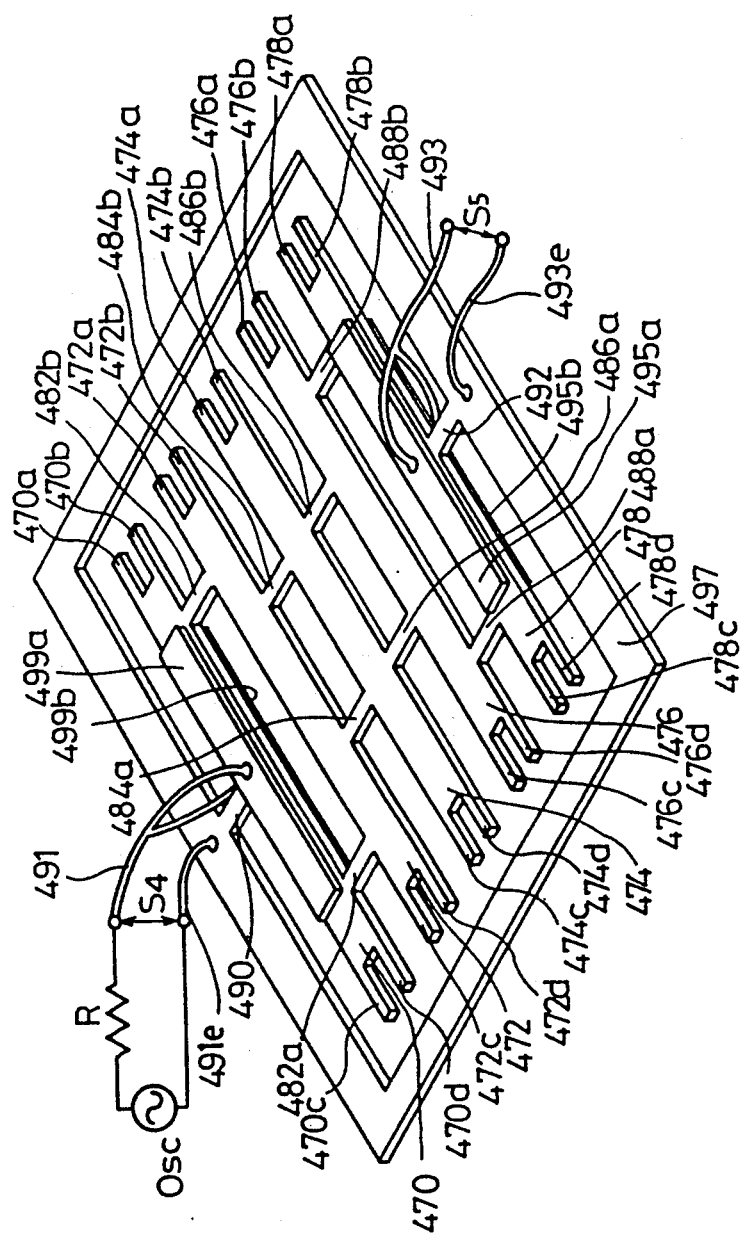
FIG. 15 is a perspective view of a composite longitudinal vibration mechanical filter according to a modification of the mechanical filter shown in FIG. 14.

A modified composite longitudinal vibration mechanical filter which includes five longitudinally vibratable tuning bars and achieves a greater amount of attenuation outside of the passband is shown FIG. 15.

The composite longitudinal vibration mechanical filter illustrated in FIG. 15 comprises input and output longitudinally vibratable tuning bars 470, 478, three longitudinally vibratable tuning bars 472, 474, 476 disposed between the longitudinally vibratable tuning bars 470, 478, and coupling elements 482a, 482b, 484a, 484b, 486a, 486b, 488a, 488b by which the longitudinally vibratable tuning bars 470, 472, 474, 476, 478 are joined together. The longitudinally vibratable tuning bars 470, 472, 474, 476, 478 have resonant frequency adjusting fingers 470a, 470(b), 470(c) and 470d, 472a, 472b, 472c and 472d, 474a, 474b, 474c and 474d, 476a, 476b, 476c and 476d, and 478a, 478b, 478c and 478d, respectively, on their distal ends.

Supporting elements 490, 492 project outwardly centrally from the input and output longitudinally vibratable tuning bars 470, 478, and have outer ends secured to respective inner confronting edges of an outer frame 497. A pair of input piezoelectric ceramic members 499a, 499b is superposed on and fixed to the opposite surfaces of the input longitudinally vibratable tuning bar 470, and a pair of output piezoelectric ceramic members 495a, 495b is superposed on and fixed to the opposite surfaces of the output longitudinally vibratable tuning bar 478. A feed line 491 and a grounding line 491e are connected respectively to the input piezoelectric ceramic members 499a, 499b, and an outlet line 493 and a grounding line 493e are connected respectively to the output piezoelectric ceramic members 495a, 495b.

The composite longitudinal vibration mechanical filter shown in FIG. 15 operates in basically the same manner as the composite longitudinal vibration mechanical filter shown in FIG. 14.

The plural longitudinally vibratable tuning bars 470, 472, 474, 476, 478 allow their respective resonant frequencies to be independently adjusted by the resonant frequency adjusting fingers 470a, 470(b), 470(c) and 470d, 472a, 472(b), 472(c) and 476b, 476c and 476d, and 478a, 478b, 478c and 478d. Therefore, the resonant frequencies can be adjusted to desired values for improved passband characteristics.

The resonant frequencies can quickly be adjusted by reducing the dimensions of one or more of the resonant frequency adjusting fingers 470a, 470(b), 470(c) and 470d, 472a, 472(b), 472(c) and 472d, 474a, 474b, 474c and 474d, 476a, 476b, 476b and 476d, and 478a, 478b, 478c and 478d with a laser beam in a non-contact manner while measuring the passband characteristics or reflecting characteristics of the composite longitudinal vibration mechanical filter.

In the embodiments shown in FIGS. 14 and 15, the resonant frequency adjusting fingers 432(a), 432(b), 432(c) and 432(d), 434(a), 434(b), 434(c) and 434(d), (FIG. 14); 470(a), 470(b), 470(c), 470(d), 472(a), 472(b), 472(c) and 472(d), 474(a), 474(b), 474(c) and 474(d), 476(a), 476(b), 476(c) and 476(d), 478(a), 478(b), 478(c) and 478(d), (FIG. 15) are disposed on the longitudinal ends of the longitudinally vibratable tuning bars 430, 434 and 470, 472, 474, 476, 478. However, the resonant frequency adjusting fingers may be disposed on transverse sides or upper or lower surfaces of the longitudinally vibratable tuning bars, and may also be dimensionally reduced for frequency adjustment.

In FIGS. 14 and 15, each tuning bar 432, 434, 470, 472, 474, 476 and 478 has four resonant frequency adjusting fingers respectively designated (a), (b), (c), (d) for example 434(a), 434(b), 434(c) and 434(d).

Instead of dimensionally reducing the resonant frequency adjusting fingers for frequency adjustment, any other suitable material such as a soldering material may be added to reduce the resonant frequencies of the longitudinally vibratable tuning bars.

As described above, the composite longitudinal vibration mechanical filters shown in FIGS. 14 and 15 have at least one resonant frequency adjusting finger disposed on a plurality of vibratable bodies including input and output vibratable bodies. The composite longitudinal vibration mechanical filters have a highly accurate central frequency. After the passband characteristics of the mechanical filters have been measured, the dimensions such as the length of the resonant frequency adjusting fingers can easily be altered for resonant frequency adjustment so that variations of the characteristics of the longitudinally vibratable tuning bars can be reduced. Through such adjustment, composite longitudinal vibration mechanical filters which are mass-produced can have uniformized central frequencies and passband characteristics, and hence have an improved quality.

Figure 16:
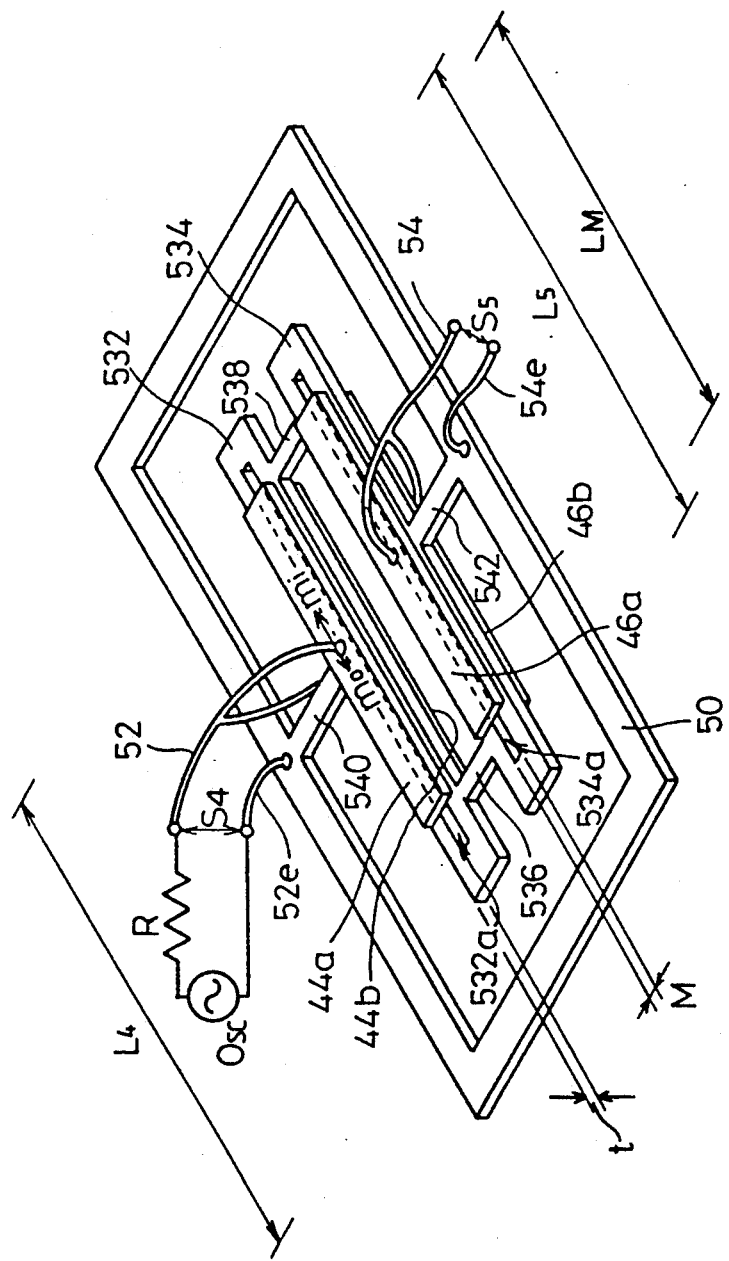
FIG. 16 is a perspective view of a composite longitudinal vibration mechanical filter according to still another embodiment of the present invention.

FIG. 16 shows a composite longitudinal vibration mechanical filter according to still another embodiment of the present invention.

The composite longitudinal vibration mechanical filter shown in FIG. 16 has an input longitudinally vibratable tuning bar 532 and an output longitudinally vibratable tuning bar 534 which is identical in shape to the input longitudinally vibratable tuning bar 532. The input and output longitudinally vibratable tuning bars 532, 534 are disposed in one plane and joined to each other by a pair of thin coupling elements 536, 538 made of an identity elastic material. Supporting elements 540, 542 project outwardly from the centers of the input and output longitudinally vibratable tuning bars 532, 534. The input and output longitudinally vibratable tuning bars 532, 534 have respective through grooves 532a, 534a defined longitudinally centrally in and shorter than the longitudinally vibratable tuning bars 532, 534. The other structural details of the mechanical filter of FIG. 16 are the same as those of the mechanical filter of FIG. 3. Those other components shown in FIG. 16 which are identical to those shown in FIG. 3 are designated by identical reference numerals, and will not be described in detail.

Operation of the composite longitudinal vibration mechanical filter shown in FIG. 16 will be described below.

As can be understood from the equations (3) and (4) above, the resonant frequency $F_4$ of the input longitudinally vibratable tuning bar 532 and the resonant frequency $F_5$ of the output longitudinally vibratable tuning bar 534 are inversely proportional to the lengths $L_4$, $L_5$ of the respective tuning bars 532, 534. The accuracy of the lengths $L_4$, $L_5$ is dependent on the photoithographic technology which is employed to fabricate the longitudinally vibratable tuning bars 532, 534. The accuracy of the lengths $L_4$, $L_5$ cannot sufficiently be high because of the thickness of the tuning bars 532, 534. Generally, the dimensional accuracy $\delta L$ of the length of the tuning bars 532, 534 is expressed by:

$$\delta L = \pm 1.5/10 \cdot t \qquad (22)$$

where t is the thickness of the tuning bars 532, 534. The dimensional accuracy $\delta L$ does not vary greatly since the input and output longitudinally vibratable tuning bars 532, 534 are simultaneously fabricated as a unitary structure by etching or the like.

The grooves 532a, 534a defined in the longitudinally vibratable tuning bars 532, 534 will hereinafter be described. Since the grooves 532a, 534a provide the same advantages for the input and output longitudinally vibratable tuning bars 532, 534, one longitudinally vibratable tuning bar will be described below.

It is assumed that a longitudinally vibratable tuning bar which has a width W has a central longitudinal groove having a width M and a length $L_M$, and that the material of which the longitudinally vibratable tuning bar is made has an average mass p.

Since the groove defined centrally in the longitudinally vibratable tuning bar extends in the direction in which longitudinal vibration is propagated therethrough, the groove does not interfere with operation of the longitudinally vibratable tuning bar. The cross-sectional area Sa of the longitudinally vibratable tuning bar where the groove is present and longitudinal vibration takes place is small because of the groove. The cross-sectional area Sa is given by:

$$Sa = (W - M) \cdot t \qquad (23)$$

The cross-sectional area Sb of the longitudinally vibratable tuning bar where no groove is present and longitudinal vibration takes place is given by:

$$Sb = W \cdot t \qquad (24)$$

If the width W of the longitudinally vibratable tuning bar is reduced by the dimensional accuracy $\delta L$ due to an etching error (overetching), then the groove is widened by $\delta L$. At this time, the cross-sectional areas Sa, Sb are expressed as follows:

$$Sa = \{(W - \delta L) - (M + \delta L)\} \cdot t \qquad (25)$$
$$= (W - M - 2\delta L) \cdot t$$
$$Sb = (W - \delta L) \cdot t \qquad (26)$$

The length L of the longitudinally vibratable tuning bar now becomes $(L - \delta L)$.

The effect of an added mass on the longitudinally vibratable tuning bar will be considered below.

(1) When $\delta L = 0$, a mass represented by $[M \cdot \{L - L_M) \cdot t \cdot \rho\}$ and commensurate with vibratable tuning bar is added to the distal end of the longitudinally vibratable tuning bar that has the cross-sectional area $\{(W - M) \cdot t\}$, and the length of the longitudinally vibratable tuning bar is indicated by L.

(2) When $\delta L \neq 0$, a mass represented by $(M + \delta L)(L - L_M) \cdot t \cdot \rho\}$ and commensurate with the width of the longitudinally vibratable tuning bar and a mass represented by $\{(-\delta L) \cdot W \cdot t \cdot \rho$ and commensurate with the length of the longitudinally vibratable tuning bar are added to the distal end of the longitudinally vibratable tuning bar that has the cross-sectional area $\{(W - M - 2\delta L) \cdot t\}$, and the length of the longitudinally vibratable tuning bar is indicated by L (though the length is indicated by $L - \delta L$, the dimensional accuracy $\delta L$ is considered as an added mass).

As a result of comparison between the equations in the cases (1) and (2) above, the mass $\delta \rho$ which is newly added when $\delta L \neq 0$ is given by the following equation:

$$\delta \rho = \delta L \cdot \{(L - L_M) - W\} \cdot t \cdot \rho \cdot \{(W - M) \cdot t \cdot \rho\} / \{(W - M - 2\delta L) \cdot t \cdot \rho\} \qquad (27)$$

If the dimensions of the longitudinally vibratable tuning bar are selected such that $(L - L_M) - W = 0$, i.e., $$L_M = L - W \qquad (28)$$

then $\delta \rho = 0$ even when $\delta L \neq 0$.

Therefore, the mass of the longitudinally vibratable tuning bar does not vary, and hence the resonant frequency of the longitudinally vibratable tuning bar does not vary.

As described above, the grooves 532a, 534a which extend in the direction in which longitudinal vibration is propagated are defined centrally in the input and output longitudinally vibratable tuning bars 532, 534. Even if the longitudinally vibratable tuning bars 532, 534 have different lengths due to an etching error which is caused when they are fabricated as a unitary structure, the central frequency of the composite longitudinal vibration mechanical filter does not vary and the bandpass characteristics thereof are not degraded because of the grooves 532a, 534a which are defined by etching in the longitudinally vibratable tuning bars 532, 534 at the same time that they are fabricated.

Another composite longitudinal vibration mechanical filter which includes five longitudinally vibratable tuning bars and achieves a greater amount of attenuation outside of the passband will be described with reference to FIG. 17.

The composite longitudinal vibration mechanical filter comprises input and output longitudinally vibratable tuning bars 570, 578, three longitudinally vibratable tuning bars 572, 574, 576 disposed between the longitudinally vibratable tuning bars 570, 578, and coupling elements 582a, 582b, 584a, 584b, 586a, 586b, 588a, 588b by which the longitudinally vibratable tuning bars 570, 572, 574, 576, 578 are joined together. The longitudinally vibratable tuning bars 570, 572, 574, 576, 578 have respective longitudinal grooves 570a, 572a, 574a, 576a, 578a defined centrally therein.

Supporting elements 590, 592 project outwardly centrally from the input and output longitudinally vibratable tuning bars 570, 578, and have outer ends secured to inner opposite edges of an outer frame 597. A pair of input piezoelectric ceramic members 599a, 599b is superposed on and fixed to the opposite surfaces of the input longitudinally vibratable tuning bar 570, and a pair of output piezoelectric ceramic members 595a, 595b is superposed on and fixed to the opposite surfaces of the output longitudinally vibratable tuning bar 578. A feed line 591 and a grounding line 591e are connected respectively to the input piezoelectric ceramic members 599a, 599b, and an outlet line 593 and a grounding line 593e are connected respectively to the output piezoelectric ceramic members 595a, 595b.

Figure 17:
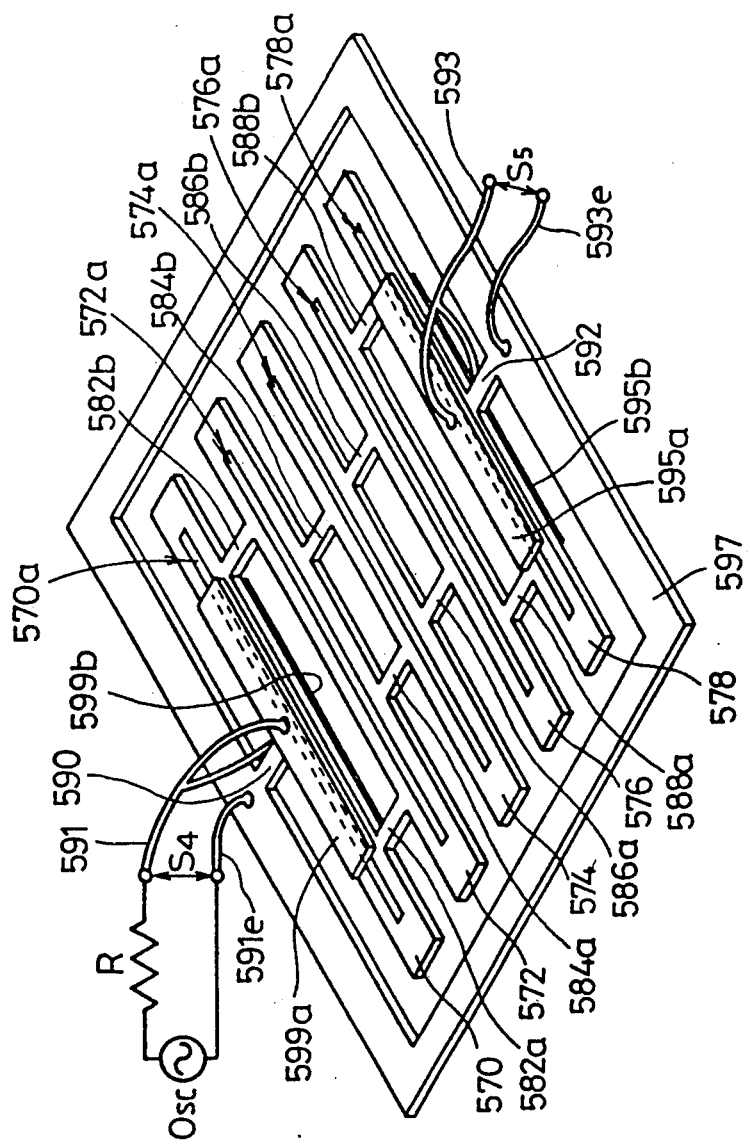
FIG. 17 is a perspective view of a composite longitudinal vibration mechanical filter according to a modification of the mechanical filter shown in FIG. 16.

The composite longitudinal vibration mechanical filter shown in FIG. 17 operates in basically the same manner as the composite longitudinal vibration mechanical filter shown in FIG. 16.

However, use of the plural longitudinally vibratable tuning bars 570, 572, 574, 576, 578 is effective in greatly reducing dimensional variations of these tuning bars, and in improving the passband characteristics of the mechanical filter.

In the embodiments shown in FIGS. 16 and 17, the grooves 532a, 534a and 570a, 572a, 574a, 576a, 578a are defined through the longitudinally vibratable tuning bars 532, 534 and 570, 572, 574, 576, 578, respectively. However, the invention is not limited to those grooves. Blind grooves may be defined in these longitudinally vibratable tuning bars, or two or more grooves may be defined in each of the longitudinally vibratable tuning bars. A groove or grooves may be defined in one or some of the longitudinally vibratable tuning bars 532, 534 and 570, 572, 574, 576, 578. A curved or discontinuous groove or grooves may be defined in the longitudinally vibratable tuning bars.

According to the embodiments shown in FIGS. 16 and 17, a through groove, a blind groove, a straight groove, a curved groove, or a groove in the form of a combination of these grooves is defined at least one of a plurality of vibratable bodies including input and output vibratable bodies.

With this arrangement, the composite longitudinal vibration mechanical filter has a highly accurate central frequency, improved bandpass characteristics, and reduced variations of the characteristics of the longitudinally vibratable tuning bars. Composite longitudinal vibration mechanical filters which ar mass-produced have uniformized characteristics and an improved quality.

Figures 18A, 18B:
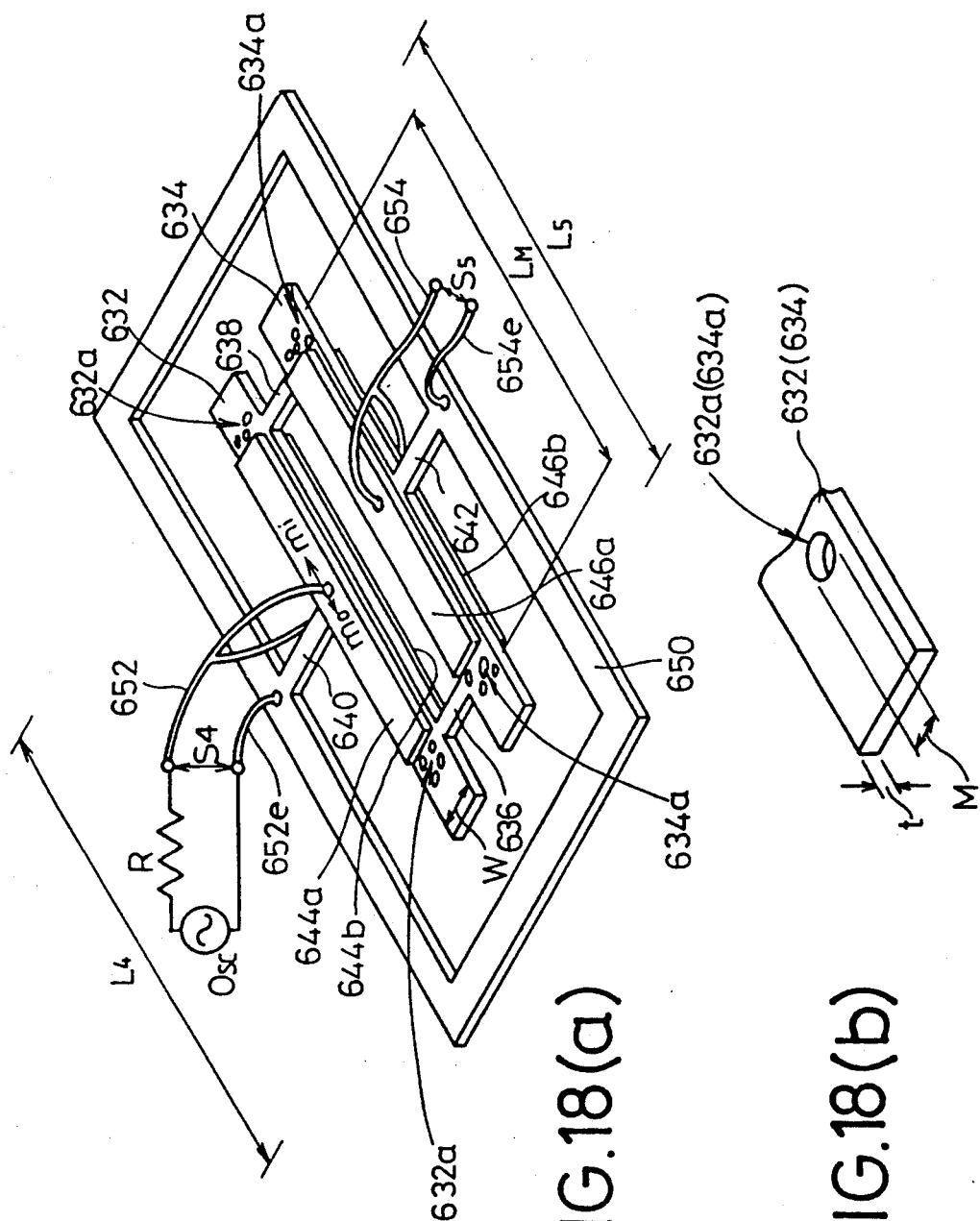
FIG. 18(a) is a perspective view of a composite longitudinal vibration mechanical filter in accordance with yet another embodiment of the present invention.
FIG. 18(b) is an enlarged fragmentary perspective view of a portion of the composite longitudinal vibration mechanical filter shown in FIG. 18(a)

FIGS. 18(a) and 18(b) show a composite longitudinal vibration mechanical filter in accordance with yet another embodiment of the present invention.

The composite longitudinal vibration mechanical filter illustrated in FIGS. 18(a) and 18(b) has an input longitudinally vibratable tuning bar 632 and an output longitudinally vibratable tuning bar 634 which is identical in shape to the input longitudinally vibratable tuning bar 632. The input and output longitudinally vibratable tuning bars 532, 634 are disposed in one plane and joined to each other by a pair of thin coupling elements 636, 638 made of an identity elastic material. Supporting elements 640, 642 project outwardly from the centers of the input and output longitudinally vibratable tuning bars 632, 634. The input and output longitudinally vibratable tuning bars 632, 634 have respective through holes 632a, 634a which have opening sizes smaller than the wavelength of the longitudinal vibration of the tuning bars. The through holes 632a, 634a are defined by etching at the same time that the longitudinally vibratable tuning bars 632, 634, the coupling elements 636, 638, and the supporting elements 640, 642 are fabricated as a unitary structure by the photolithographic process. The other structural components are the same as those of the composite longitudinal vibration mechanical filter shown in FIG. 6. Therefore, those identical components are denoted by identical reference numerals, and will not be described in detail.

Operation of the composite longitudinal vibration mechanical filter shown in FIGS. 18(a) and 18(b) is as follows:

As can be understood from the equations (3) and (4) above, the resonant frequency $F_4$ of the input longitudinally vibratable tuning bar 632 and the resonant frequency $F_5$ of the output longitudinally vibratable tuning bar 634 are inversely proportional to the lengths $L_4$, $L_5$ of the respective tuning bars 632, 634. The accuracy of the lengths $L_4$, $L_5$ is dependent on the photolithographic technology which is employed to fabricate the longitudinally vibratable tuning bars 632, 634. The accuracy of the lengths $L_4$, $L_5$ cannot sufficiently be high because of the thickness of the tuning bars 632, 634. Generally, the dimensional accuracy $\delta L$ of the length of the tuning bars 632, 634 is expressed by:

$$\delta L = \pm 1.5/10 \cdot t \tag{29}$$

where t is the thickness of the tuning bars 632, 634. The dimensional accuracy $\delta L$ does not vary greatly since the input and output longitudinally vibratable tuning bars 632, 634 with the through holes 632a, 634a are simultaneously fabricated as a unitary structure by etching. The signs of the equation (28) remain the same as those of the equation (5). W is the width of the tuning bar and $L_M$ is the length of the groove and/or the length where the through holes exist.

The through holes 632a, 634a defined in the longitudinally vibratable tuning bars 632, 634 will hereinafter be described.

It is assumed that the longitudinally vibratable tuning bars 632, 634 have a length L ($L_4$, $L_5$), the through holes 632a, 634a have a width M (see FIG. 18(b)), the distribution ratio of the through holes 632a, 634a in the input and output longitudinally vibratable tuning bars 632, 634 (the ratio of the sum of the areas of the through holes to the entire area of the central portion of the longitudinally vibratable tuning bar) is indicated by $\gamma$, the input and output longitudinally vibratable tuning bars 632, 634 have a width W, and the length of the longitudinally vibratable tuning bars 632, 634 where the through holes 632a, 634a are present (in the direction in which the longitudinal vibration is propagated) is indicated by $L_M$, and also that the material of which the longitudinally vibratable tuning bars 632, 634 are made has an average mass $\rho$.

Since the through holes 632a, 634a defined in the input and output longitudinally vibratable tuning bars 632, 634 are sufficiently small as compared with the wavelength of the longitudinal vibration, the through holes 632a, 634a do not interfere with operation of the input and output longitudinally vibratable tuning bars. The cross-sectional area Sc of the longitudinally vibratable tuning bars where the through holes 632a, 634a are present and longitudinal vibration takes place is small because of the through holes 632a, 634a. The cross-sectional area Sc is given by:

$$Sc = (W - \gamma M) \cdot t \qquad (30)$$

The cross-sectional area $S_d$ of the longitudinally vibratable tuning bars where no through holes are present and longitudinal vibration takes place is given by:

$$Sd = W \cdot t \qquad (31)$$

If the width W of the longitudinally vibratable tuning bars is reduced by the dimensional accuracy $\delta L$ due to an etching error (overetching), then each of the through holes 632a, 634a is widened by $\delta L$. At this time, the cross-sectional areas Sc, Sd are expressed as follows:

$$\begin{aligned} S_c &= \{(W - \delta L) - \gamma(M + \delta L)\} \cdot t \\ &= \{W - \gamma M - (1 + \gamma)\delta L\} \cdot t \end{aligned} \qquad (32)$$

$$S_d = (W - \delta L) \cdot t \qquad (33)$$

The length L ($L_4$, $L_5$) of the input and output longitudinally vibratable tuning bars 632, 634 now becomes $(L - \delta L)$.

The effect of an added mass on the input and output longitudinally vibratable tuning bars 632, 634 will be considered below.

(1) When $\delta L = 0$, a mass represented by $\{\gamma M \cdot (L - L_M) \cdot t \cdot \rho\}$ and commensurate with the width W of the longitudinally vibratable tuning bars is added to the distal ends of the input and output longitudinally vibratable tuning bars 632, 634 that have the cross-sectional area $\{W - \gamma M\} \cdot t$, and the length of the input and output longitudinally vibratable tuning bars 632, 634 is indicated by L.

(2) When $\delta L \neq 0$, a mass represented by $\{(\gamma M + \gamma \delta L) \cdot (L - L_M) \cdot t \cdot \rho\}$ and commensurate with the width W of the longitudinally vibratable tuning bars and a mass represented by $\{(-\delta L) \cdot W \cdot t \cdot \rho\}$ and commensurate with the length L ($L_4$, $L_5$) of the longitudinally vibratable tuning bars are added to the distal ends of the input and output longitudinally vibratable tuning bars 632, 634 that have the cross-sectional area $(W - \gamma M - (1 + \gamma)\delta L) \cdot t$, and the length of the longitudinally vibratable tuning bars is indicated by L (though the length is indicated by $L - \delta L$, the dimensional accuracy $\delta L$ is considered as an added mass).

As a result of comparison between the equations in the cases (1) and (2) above, the mass $\delta \rho$ which is newly added when $\delta L \neq 0$ is given by the following equation:

$$\delta \rho = \delta L \cdot \{\gamma(L - L_M) - W\} \cdot t \cdot \rho \cdot \{(W - \gamma M \cdot t \cdot \rho)/\{(W - \gamma M - (1 + \gamma)\delta L) \cdot t \cdot \rho\}\} \qquad (34)$$

If the dimensions of the longitudinally vibratable tuning bars are selected such that $\gamma(L - L_M) - W = 0$, i.e., $$L_M = L - W/\gamma \qquad (35)$$

then $\delta \rho = 0$ even when $\delta L \neq 0$.

Therefore, the mass of the longitudinally vibratable tuning bars does not vary, and hence the resonant frequency of the input and output longitudinally vibratable tuning bars 632, 634 does not vary.

As described above, the through holes 632a, 634a which have an opening size sufficiently smaller than the wavelength of the longitudinal vibration is defined in the input and output longitudinally vibratable tuning bars 632, 634. Even if the longitudinally vibratable tuning bars 632, 634 do not have a sufficient dimensional accuracy, i.e., they have different lengths due to an etching error which is caused when they are fabricated as a unitary structure, the central frequency of the composite longitudinal vibration mechanical filter does not vary and the bandpass characteristics thereof are not degraded because of the through holes 632a, 634a which are defined by etching in the longitudinally vibratable tuning bars 632, 634 at the same time that they are fabricated.

Another composite longitudinal vibration mechanical filter which includes five longitudinally vibratable tuning bars and achieves a greater amount of attenuation outside of the passband will be described with reference to FIG. 19.

The composite longitudinal vibration mechanical filter comprises input and output longitudinally vibratable tuning bars 670, 678, three longitudinally vibratable tuning bars 672, 674, 676 disposed between the longitudinally vibratable tuning bars 670, 678, and coupling elements 682a, 682b, 684a, 684b, 686a, 686b, 688a, 688b by which the longitudinally vibratable tuning bars 670, 672, 674, 676, 678 are joined together. The longitudinally vibratable tuning bars 670, 672, 674, 676, 678 have plural through holes 670a, 672a, 674a, 676a, 678a defined therein.

Supporting elements 690, 692 project outwardly centrally from the input and output longitudinally vibratable tuning bars 670, 678, and have outer ends secured to inner opposite edges of an outer frame 697. A pair of input piezoelectric ceramic members 699a, 699b is superposed on and fixed to the opposite surfaces of the input longitudinally vibratable tuning bar 670, and a pair of output piezoelectric ceramic members 695a, 695b is superposed on and fixed to the opposite surfaces of the output longitudinally vibratable tuning bar 678. A feed line 691 and a grounding line 691e are connected respectively to the input piezoelectric ceramic members 699a, 699b, and an outlet line 693 and a grounding line 693e are connected respectively to the output piezoelectric ceramic members 695a, 695b.

Figure 19:
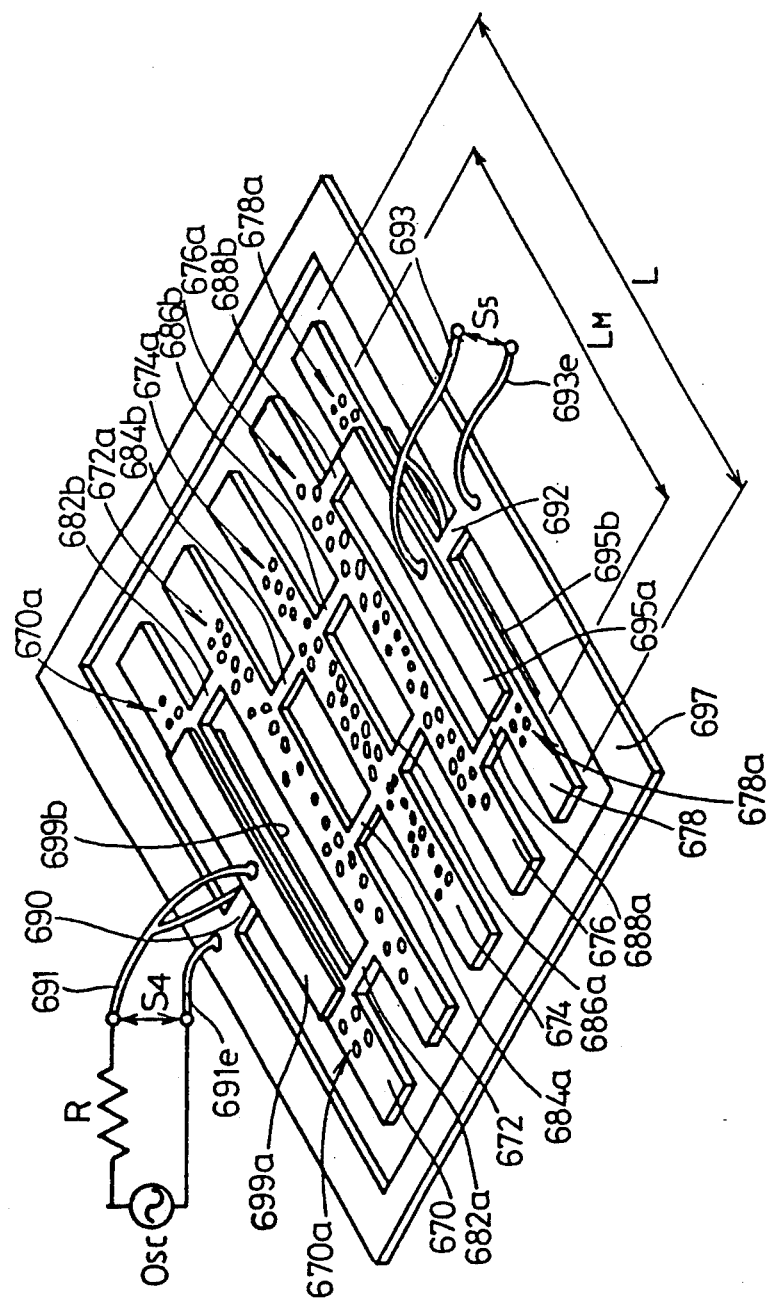
FIG. 19 is a perspective view of a composite longitudinal vibration mechanical filter according to a modification of the mechanical filter illustrated in FIGS. 18(a) and 18(b)

The composite longitudinal vibration mechanical filter shown in FIG. 19 operates in basically the same manner as the composite longitudinal vibration mechanical filter shown in FIG. 7.

However, use of the plural longitudinally vibratable tuning bars 670, 672, 674, 676, 678 is effective in greatly reducing dimensional variations of these tuning bars, and in improving the passband characteristics of the mechanical filter. Inputs are provided via leads 691, 691e, and outputs are obtained across leads 693, 693e. In the embodiments shown in FIGS. 18 and 19, the through holes 632a, 634a and 670a, 672a, 674a, 676a, 678a are defined through the longitudinally vibratable tuning bars 632, 634 and 670, 672, 674, 676, 678, respectively. However, the invention is not limited to those grooves. Through holes and/or blind holes or recesses may be defined in these longitudinally vibratable tuning bars, or two or more holes may be defined in one or some of the longitudinally vibratable tuning bars 632, 634, and 670, 672, 674, 676, 678.

As described above, the embodiments shown in FIGS. 18 and 19 reside in that through holes and/or blind holes may be defined in at least one of the vibratable bodies including the input and output vibratable bodies.

With the above arrangement, the composite longitudinal vibration mechanical filter has a highly accurate central frequency, improved passband characteristics, reduced characteristic variations between the longitudinally vibratable tuning bars, provides uniform characteristics when it is mass-produced, and is of improved quality.

Figure 20:
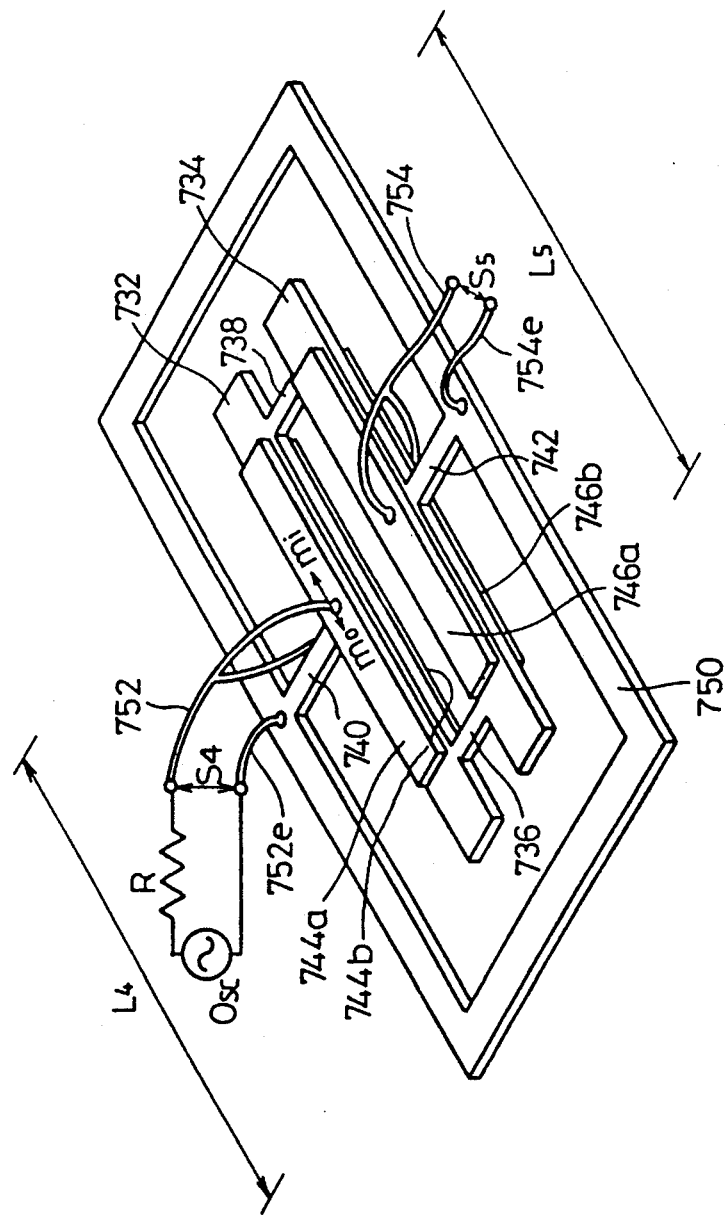
FIG. 20 is a perspective view of a composite longitudinal vibration mechanical filter according to a still further embodiment of the present invention.

FIG. 20 shows a composite longitudinal vibration mechanical filter according to a still further embodiment of the present invention. The composite longitudinal vibration mechanical filter has coupling elements 736, 738 which are positioned near the distal ends of input and output longitudinally vibratable tuning bars 732, 734, i.e., in regions where the longitudinally vibratable tuning bars are displaced to a large extent in the direction in which the longitudinal vibration takes place. The vibration is propagated (coupled) via the coupling elements 736, 738 as a transverse wave, i.e., so-called flexural vibration, so that spurious responses are reduced and the passband characteristics are improved.

The composite longitudinal vibration mechanical filter shown in FIG. 20 is substantially identical to the composite longitudinal vibration mechanical filter shown in FIG. 9.

Reduction of spurious responses with the structure shown in FIG. 20 will be described below.

The input and output longitudinally vibratable tuning bars 732, 734 are displaced to a greater extent at their distal ends in the direction in which the longitudinal vibration takes place. Displacement of the longitudinally vibratable tuning bars 732, 734 in a direction normal to the longitudinal direction is greater at the center of the longitudinally vibratable tuning bars 732, 734. The displacement by the longitudinal vibration of the input longitudinally vibratable tuning bar 732 in the direction of the longitudinal vibration, and the displacement thereof in the direction normal to the longitudinal vibration, are transmitted (coupled) to the output longitudinally vibratable tuning bar 734 via the coupling elements 736, 738.

At this time, not only the displacement normal to the longitudinal vibration is coupled to the longitudinal vibration of the output longitudinally vibratable tuning bar 734 through the coupling elements 736, 738, but also vibration in another mode is coupled to the longitudinal vibration of the output longitudinally vibratable tuning bar 734. Therefore, spurious responses are of a large value, deteriorating the filter characteristics. The vibration normal to the longitudinal vibration is propagated mainly as a longitudinal wave in the coupling elements 736, 738, and the displacement in the direction of the longitudinal vibration produces smaller spurious responses than the displacement normal to the longitudinal vibration as it is coupled to the longitudinal vibration of the output longitudinally vibratable tuning bar 34 via the coupling elements 736, 738. The longitudinal vibration is propagated as flexural vibration in the coupling elements 736, 738.

The coupling elements 736, 738 are disposed in the regions where the displacement in the direction of the longitudinal vibration is large, near the distal ends of the input and output longitudinally vibratable tuning bars 732, 734. The input and output longitudinally vibratable tuning bars 732, 734 are coupled to each other by the flexural vibration via the coupling elements 736, 738. Accordingly, spurious responses are reduced, and the pass-band characteristics are improved.

The displacement of the input longitudinally vibratable tuning bar 732 in the direction of the longitudinal vibration is larger at its distal ends, and is represented as a function of the position in the direction of the longitudinal vibration. In order to provide desired frequency characteristics and reduce dimensional variations of the longitudinally vibratable tuning bars, it is necessary to uniformize the amount of coupling of the output longitudinally vibratable tuning bar 734 to the input longitudinally vibratable tuning bar 732. The coupling elements 736, 738 should be positioned relatively to the input longitudinally vibratable tuning bar 732 as constantly as possible. More specifically, the relative position between the input and output longitudinally vibratable tuning bars 732, 734 and the coupling elements 736, 738 can be rendered constant by fabricating the input and output longitudinally vibratable tuning bars 732, 734 and the coupling elements 736, 738 from a single sheet by etching according to the photolithographic process.

Figure 21:
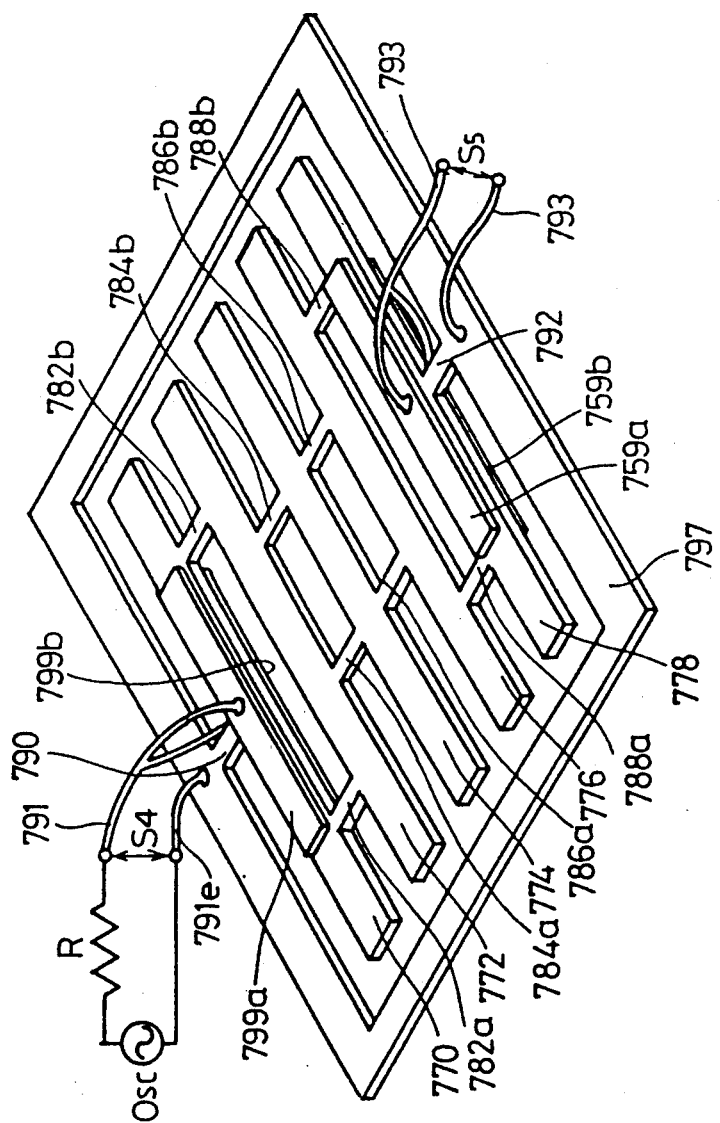
FIG. 21 is a perspective view of a composite longitudinal vibration mechanical filter according to a modification of the mechanical filter shown in FIG. 20.

Another composite longitudinal vibration mechanical filter which comprises five longitudinally vibratable tuning bars and provides increased frequency attenuation outside of the passband is illustrated in FIG. 21.

The composite longitudinal vibration mechanical filter shown in FIG. 21 comprises input and output longitudinally vibratable tuning bars 770, 778, three longitudinally vibratable tuning bars 772, 774, 776 disposed between the longitudinally vibratable tuning bars 770, 778, and coupling elements 782a, 782b, 784a, 784b, 786a, 786b, 788a, 788b by which the longitudinally vibratable tuning bars 770, 772, 774, 776, 778 are joined together.

Supporting elements 790, 792 project outwardly centrally from the input and output longitudinally vibratable tuning bars 770, 778, and have outer ends secured to inner opposite edges of an outer frame 797. A pair of input piezoelectric ceramic members 799a, 799b is superposed on and fixed to the opposite surfaces of the input longitudinally vibratable tuning bar 770, and a pair of output piezoelectric ceramic members 795a, 795b is superposed on and fixed to the opposite surfaces of the output longitudinally vibratable tuning bar 778. The composite longitudinal vibration mechanical filter also has a feed line 791 and a grounding line 791e which are connected respectively to the input piezoelectric ceramic members 799a, 799b, and an outlet line 793 and a grounding line 793e which are connected respectively to the output piezoelectric ceramic members 759a, 759b.

The composite longitudinal vibration mechanical filter shown in FIG. 21 operates in basically the same manner as the composite longitudinal vibration mechanical filter shown in FIG. 20.

With the plural longitudinally vibratable tuning bars 770, 772, 774, 776, 778 employed, dimensional variations of these tuning bars are reduced, and the passband characteristics of the mechanical filter are improved.

According to the above embodiments shown in FIGS. 20 and 21, the composite longitudinal vibration mechanical filter for delivering a supplied high-frequency signal in a predetermined frequency range includes a plurality of longitudinally vibratable bodies including input and output vibratable bodies for receiving and delivering the high-frequency signal, the vibratable bodies being longitudinally vibratable in a range close to the passband of the mechanical filter, a plurality of piezoelectric members superposed on the input and output vibratable bodies and including electrodes to which conductors are connected, and a plurality of coupling elements disposed between ends of the vibratable bodies and coupling them through flexural vibration.

With such an arrangement, the composite longitudinal vibration mechanical filter has a highly accurate central frequency, improved passband characteristics, provides uniform characteristics when it is mass-produced, and is of improved quality.

Although certain preferred embodiments have been shown and described, it should be understood that many changes and modifications may be made therein without departing from the scope of the appended claims.

What is claimed is:

1. A method of manufacturing a composite longitudinal vibration mechanical filter including a plurality of vibratable bodies having input and output vibratable bodies with piezoelectric members superposed thereon, coupling elements for coupling the vibratable bodies to each other, supporting elements projecting respectively from the input and output vibratable bodies, and a holder to which the supporting elements are attached, said method including the steps of:

fabricating said vibratable bodies to have a predetermined length, said vibratable bodies being longitudinally vibratable along said predetermined length thereof;

forming grooves in at least one of said vibratable bodies during said fabricating step, said grooves extending a preselected length along said predetermined length along which the vibratable bodies are longitudinally vibratable, said preselected length being shorter than said predetermined length of the vibratable bodies; and superposing the piezoelectric members fixedly on the input and output vibratable bodies in sandwiching relation thereto.

2. A method according to claim 1, wherein said grooves are formed in at least one of said vibratable bodies by a photolithographic process.

3. A method according to claim 1, wherein the forming step for forming each of said grooves comprises forming at least one of a through-hole and a recess.

4. A method according to claim 3, wherein said grooves are formed in at least one of said vibratable bodies by a photolithographic process.

5. A method according to claim 1 further comprising the steps of:

forming each of the vibratable bodies to be vibratable in a range close to a pass band of the mechanical filter and to have a first end portion and a second end portion; and disposing the coupling elements between a first end portion of one of said vibratable bodies and a second end portion of another of said vibratable bodies for coupling said vibratable bodies together through flexural vibrations; and also forming said vibratable bodies and said coupling elements as a unitary structure from a single flat sheet by a photolithographic process.

6. A composite longitudinal vibration mechanical filter for receiving a supplied high-frequency signal at an input thereof and delivering out a high-frequency signal in a predetermined frequency range at an output thereof, said composite longitudinal vibration mechanical filter vibrating at a preselected central frequency, comprising:

a plurality of vibratable bodies, each having a predetermined length and including a high-frequency signal input vibratable body and a high-frequency output vibratable body, said input vibratable body being coupled to said input of the vibration mechanical filter, said plurality of vibratable bodies being positioned between the input and the output of the vibration mechanical filter, each of said vibratable bodies being longitudinally vibratable along said predetermined length thereof in a range close to a passband of the mechanical filter, said input vibratable body vibrating when the received high frequency signal is supplied to the input of the vibration mechanical filter;

said output vibratable body being coupled to said output;

piezoelectric members respectively superposed on said input and output vibratable bodies, said piezoelectric members having respective electrodes connected to at least one conductor;

a plurality of coupling elements for coupling said plurality of vibratable bodies to each other through flexural vibration;

supporting elements projecting respectively from said input and output vibratable bodies; and a holder, holding a plurality of the vibratable bodies and coupling elements through said supporting elements;

central frequency deviation eliminating means, disposed in at least one of said plurality of vibratable bodies, for eliminating deviation of the central frequency of said vibration mechanical filter along the predetermined length of the at least one of the plurality of vibratable bodies, including said input and output vibratable bodies; and wherein said plurality of vibratable bodies, coupling elements, supporting elements, and holder are substantially flat.

7. A composite longitudinal vibration mechanical filter according to claim 6, wherein at least said input and output vibratable bodies, coupling elements, supporting elements, holders, and said means for eliminating deviation of said central frequency are disposed together as a substantially flat integral body.

8. A composite longitudinal vibration mechanical filter according to claim 6, wherein said means for eliminating deviation of said central frequency comprises at least one through-hole disposed along the predetermined length of said vibratable body.

9. A composite longitudinal vibration mechanical filter according to claim 8, wherein said at least one through-hole is a single hole disposed along the predetermined length of said vibratable body.

10. A composite longitudinal vibration mechanical filter according to claim 8, wherein said at least one through-hole comprises a plurality of circular holes formed along the predetermined length of said vibratable bodies.

11. A composite longitudinal vibration mechanical filter according to claim 6, wherein said means for eliminating deviation of said central frequency comprises at least one recess disposed along the predetermined length of said vibratable body.

12. A composite longitudinal vibration mechanical filter according to claim 11, wherein said at least one recess is a single recess disposed along the predetermined length of said vibratable body.

13. A composite longitudinal vibration mechanical filter according to claim 11, wherein said at least one recess comprises a plurality of circular recesses formed along the predetermined length of said vibratable body.

14. A composite longitudinal vibration mechanical filter according to claim 6, wherein said means for eliminating deviation of said central frequency comprises at least one projection projecting from at least one of said plurality of vibratable bodies including the input and the output vibratable bodies.

15. A composite longitudinal vibration mechanical filter according to claim 14, wherein said at least one projection comprises two projections projecting outward from an end portion of said at least one of said plurality of vibratable bodies.

16. A method of manufacturing a composite longitudinal vibration mechanical filter that vibrates at a preselected central frequency, wherein the filter comprises:
 a plurality of vibratable bodies including input and output vibratable bodies with piezoelectric members superposed thereon, each of said vibratable bodies having a predetermined length;
 coupling elements which couple the vibratable bodies to each other;
 supporting elements projecting respectively from the input and output vibratable bodies; and
 a holder to which the supporting elements are attached,
 said method comprising:
 a first step of forming, at the same time, an integral body comprising said plurality of vibratable bodies including at least said input and output vibratable bodies, said coupling elements, said supporting elements and said holder, providing said integral body during said first step with central frequency deviation eliminating means for eliminating a deviation of the central frequency of said composite longitudinal vibration mechanical filter, said central frequency deviation eliminating means being provided in at least one of said vibratable bodies;
 a second step of superposing said piezoelectric members fixedly on the input and output vibratable bodies in sandwiching relation thereto; and
 a third step of connecting electrodes to said piezoelectric members.

17. A method of manufacturing a composite longitudinal vibration mechanical filter according to claim 16, wherein said step of providing said integral body with means for eliminating a deviation of said central frequency comprises forming at least one recess along the predetermined length of at least one of said vibratable bodies.

18. A method of manufacturing a composite longitudinal vibration mechanical filter according to claim 17, wherein the forming step for forming said recess comprises forming a single recess along the predetermined length if said at least one vibratable body.

19. A method of manufacturing a composite longitudinal vibration mechanical filter according to claim 16, wherein said step of providing said integral body with means for eliminating deviation of said central frequency, comprises providing at least a projection projecting from said at least one vibratable body.

20. A method of manufacturing a composite longitudinal vibration mechanical filter according to claim 19, wherein the step of providing said at least a projection projecting from said at least one vibratable body includes providing a a plurality of projections projecting outward from an end portion of said at least one vibratable body.

21. A method of manufacturing a composite longitudinal vibration mechanical filter according to claim 16, wherein said step of providing said integral body with means for eliminating a deviation of said central frequency comprises forming at least one through-hole along the predetermined length of at least one of said vibratable bodies.

22. A method of manufacturing a composite longitudinal vibration mechanical filter according to claim 21, further comprising forming said through-hole as a single hole positioned along the predetermined length of said at least one vibratable body.

23. A method of manufacturing a composite longitudinal vibration mechanical filter according to claim 16, wherein said first step comprises forming, at the same time by a photolithographic process, said integral body comprising said plurality of vibratable bodies including at least said input and output vibratable bodies, said coupling elements, said supporting elements, said holder, and said means for eliminating deviation of said central frequency.

24. A composite longitudinal vibration mechanical filter for receiving a supplied high-frequency signal at an input thereof and delivering out a high frequency signal in a predetermined frequency range at an output thereof, comprising:
 a plurality of vibratable bodies including an input and an output vibratable body, said plurality of input and output vibratable bodies having respective piezoelectric members superposed thereon, said input of the filter being connected to said input vibratable body, said output of the filter being connected to said output vibratable body, said plurality of vibratable bodies being positioned between the input and the output of the vibration mechanical filter, each of said plurality of vibratable bodies having a predetermined length, each of said plurality of vibratable bodies respectively being longitudinally vibratable along said predetermined length thereof, and said input vibratable body vibrating when the received high frequency signal is supplied to the input of the vibration mechanical filter;

coupling elements for coupling said plurality of vibratable bodies to each other, so that said output vibratable body vibrates when the input vibratable body vibrates to generate output vibrations that are provided to the output of the vibration mechanical filter;

supporting elements projecting respectively from said input and output vibratable bodies;

a holder to which said supporting elements are attached; and at least one of a through hole and a recess positioned in at least one of said vibratable bodies, said at least one of a through hole and a recess extending along said predetermined length along which the at least one vibratable body is longitudinally vibratable, said at least one of a through hole and a recess having a preselected length shorter than said predetermined length of the at least one vibratable body.

* * * * *